(12) United States Patent
Ejiri

(10) Patent No.: US 12,354,848 B2
(45) Date of Patent: Jul. 8, 2025

(54) SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventor: Yasunori Ejiri, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 146 days.

(21) Appl. No.: 18/105,404

(22) Filed: Feb. 3, 2023

(65) Prior Publication Data
US 2023/0187180 A1 Jun. 15, 2023

Related U.S. Application Data

(63) Continuation of application No. PCT/JP2021/035033, filed on Sep. 24, 2021.

(30) Foreign Application Priority Data

Sep. 24, 2020 (JP) .................. 2020-159571

(51) Int. Cl.
*H01J 37/32* (2006.01)
*H01L 21/687* (2006.01)

(52) U.S. Cl.
CPC .. *H01J 37/32642* (2013.01); *H01J 37/32449* (2013.01); *H01J 37/32541* (2013.01);
(Continued)

(58) Field of Classification Search
CPC ........... H01J 37/32642; H01J 37/32449; H01J 37/32541; H01J 37/32568;
(Continued)

(56) References Cited

U.S. PATENT DOCUMENTS

| 4,062,318 A | * | 12/1977 | Ban | ................... C23C 16/45506 118/724 |
| 4,263,872 A | * | 4/1981 | Ban | ..................... C23C 16/4584 118/721 |

(Continued)

FOREIGN PATENT DOCUMENTS

| JP | 2003218040 A | 7/2003 |
| JP | 2007531269 A | 11/2007 |

(Continued)

*Primary Examiner* — Rudy Zervigon
(74) *Attorney, Agent, or Firm* — Edell, Shapiro & Finnan, LLC

(57) ABSTRACT

According to one aspect of the technique of the present disclosure, there is provided a substrate processing apparatus including: a process chamber; a process gas supplier through which a process gas is supplied into the process chamber; an exhauster through which an inner atmosphere of the process chamber is exhausted; a plasma generating structure configured to supply a plasma into the process chamber; a boat configured to accommodate a plurality of substrates in the process chamber; a rotary shaft configured to rotatably support the boat; and an internal conductor provided inside the rotary shaft and electrically connected to the boat; wherein the boat is made of a non-metallic material, at least a part of a surface of the boat is conductive, and the boat is configured to electrically connect the internal conductor and the plurality of substrates.

19 Claims, 7 Drawing Sheets

(52) U.S. Cl.
CPC .. *H01J 37/32568* (2013.01); *H01J 37/32577* (2013.01); *H01J 37/32715* (2013.01); *H01J 37/32825* (2013.01); *H01J 37/32834* (2013.01); *H01L 21/68757* (2013.01); *H01L 21/68764* (2013.01); *H01J 2237/3323* (2013.01)

(58) Field of Classification Search
CPC ........... H01J 37/32577; H01J 37/32715; H01J 37/32825; H01J 37/32834; H01J 2237/3323; H01J 15/00; H01J 37/32091; H01J 37/32082; H01J 37/3244; H01J 37/32623; H01J 37/32009; H01J 37/32532; H01L 21/68757; H01L 21/68764; H01L 21/31; H01L 21/67109; H01L 21/68771; H01L 21/68792; H01L 21/67303; H01L 21/67069; H01L 21/6719; H01L 21/67196; H01L 21/67201; H01L 21/67173; H01L 21/67184; H01L 21/6776; H01L 21/67161; H01L 21/67155; H01L 21/67017; H01L 21/67748; H01L 21/67751; H01L 21/67745; C23C 16/452; C23C 16/455; C23C 16/458; C23C 16/50; C23C 16/507; C23C 16/505; C23C 16/4412; C23C 16/4584; C23C 16/52; C23C 16/509; C23C 16/5096; C23C 16/45565; C23C 16/54; C23C 16/45551; C23C 16/545; C23C 14/568; C23C 16/4401; C23C 14/505; C30B 25/12; C30B 25/14
USPC ............ 156/345.55, 345.43, 345.44, 345.45, 156/345.46, 345.47; 118/730, 723 E, 118/723 ER
See application file for complete search history.

(56) References Cited

U.S. PATENT DOCUMENTS

| | | | | |
|---|---|---|---|---|
| 4,381,965 | A * | 5/1983 | Maher, Jr. ......... | H01J 37/32568 156/345.47 |
| 4,401,689 | A * | 8/1983 | Ban ....................... | C23C 16/455 219/405 |
| 4,486,461 | A * | 12/1984 | Ito ......................... | H01L 21/324 427/591 |
| 4,576,830 | A * | 3/1986 | Kiss ....................... | C23C 16/54 136/258 |
| 4,633,811 | A * | 1/1987 | Maruyama ............... | C23C 16/52 118/50.1 |
| 4,661,033 | A * | 4/1987 | Worsham ........... | H01L 21/67313 414/940 |
| 5,002,011 | A * | 3/1991 | Ohmine .............. | C23C 16/4588 118/725 |
| 5,151,133 | A * | 9/1992 | Ohmine .............. | C23C 16/4588 118/725 |
| 5,515,986 | A * | 5/1996 | Turlot ................. | C23C 16/5096 156/345.31 |
| 5,653,810 | A * | 8/1997 | Kataoka ........... | H01L 21/28562 118/724 |
| 5,795,452 | A * | 8/1998 | Kinoshita ........... | H01J 37/3405 156/345.46 |
| 6,296,735 | B1 * | 10/2001 | Marxer ................. | C23C 14/566 156/345.55 |
| 6,321,680 | B2 * | 11/2001 | Cook .................... | C23C 16/481 118/725 |
| 6,673,255 | B2 * | 1/2004 | Marxer ............. | H01L 21/67748 156/345.55 |
| 7,927,455 | B2 * | 4/2011 | Kishimoto ........ | H01J 37/32009 156/345.43 |
| 9,524,853 | B2 * | 12/2016 | Torregrosa ........ | H01J 37/32412 |
| 2001/0003272 | A1 * | 6/2001 | Schmitt ................... | C23C 16/44 156/345.43 |
| 2001/0029892 | A1 * | 10/2001 | Cook .................... | C23C 16/481 118/723 E |
| 2005/0211264 | A1 | 9/2005 | Kostenko et al. | |
| 2006/0151319 | A1 * | 7/2006 | Kishimoto ........ | H01J 37/32431 204/298.08 |
| 2006/0189168 | A1 * | 8/2006 | Sato ........................ | H05H 1/46 438/795 |
| 2006/0191480 | A1 * | 8/2006 | Kishimoto .......... | H01J 37/3244 156/345.45 |
| 2009/0137128 | A1 * | 5/2009 | Ko ..................... | H01J 37/32009 156/345.43 |
| 2009/0255630 | A1 * | 10/2009 | Toyoda ............. | H01J 37/32009 156/345.43 |
| 2010/0006427 | A1 * | 1/2010 | Rudhard ........... | H01L 21/67069 156/345.43 |
| 2012/0100722 | A1 * | 4/2012 | Asai ..................... | H01L 21/0337 438/758 |
| 2016/0284543 | A1 * | 9/2016 | Toyoda ............. | H01J 37/32715 |
| 2017/0076915 | A1 * | 3/2017 | Boyd, Jr. ............. | C23C 16/4586 |
| 2019/0157049 | A1 * | 5/2019 | Sato ..................... | C23C 16/50 |
| 2019/0341289 | A1 * | 11/2019 | Parkhe ............. | H01L 21/68785 |
| 2020/0173027 | A1 | 6/2020 | Takeda | |
| 2020/0312632 | A1 | 10/2020 | Hara et al. | |
| 2020/0365388 | A1 | 11/2020 | Asai et al. | |
| 2021/0358726 | A1 * | 11/2021 | Ko ..................... | H01L 21/67253 |
| 2023/0187180 | A1 * | 6/2023 | Ejiri .................. | H01L 21/67109 427/569 |

FOREIGN PATENT DOCUMENTS

| | | |
|---|---|---|
| JP | 2008270477 A | 11/2008 |
| JP | 2020161539 A | 10/2020 |
| JP | 2020188237 A | 11/2020 |
| WO | 2018016131 A1 | 1/2018 |
| WO | 2019035223 A1 | 2/2019 |

* cited by examiner

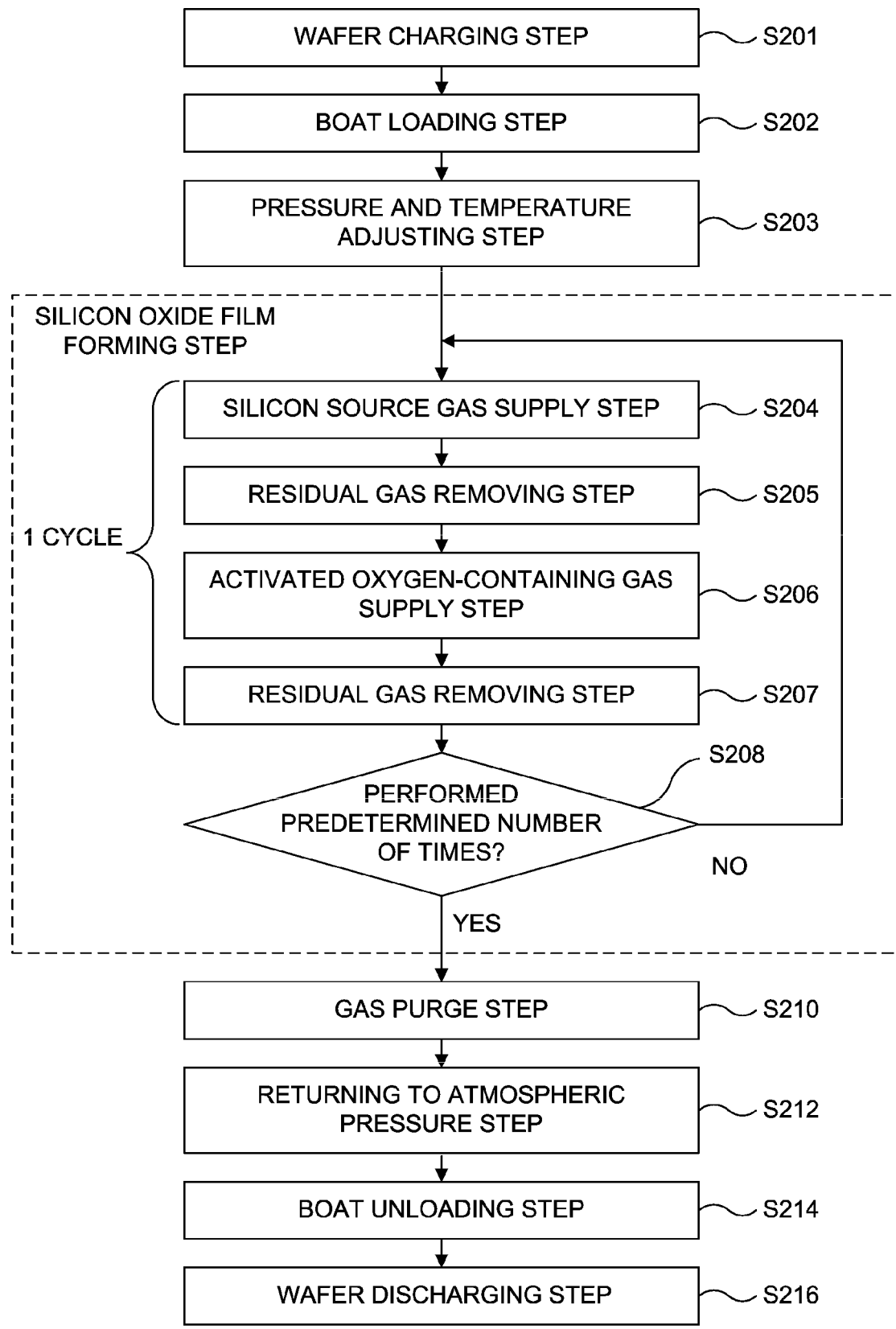

SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a bypass continuation application of PCT International Application No. PCT/JP2021/035033, filed on Sep. 24, 2021, in the WIPO, the international application being based upon and claiming the benefit of priority from Japanese Patent Application No. 2020-159571, filed on Sep. 24, 2020, in the Japanese Patent Office, the entire contents of which are hereby incorporated by reference.

TECHNICAL FIELD

The present disclosure relates to a substrate processing apparatus, a substrate processing method, a method of manufacturing a semiconductor device and a non-transitory computer-readable recording medium, and more particularly, to a technique of processing a substrate using a plasma.

BACKGROUND

In a manufacturing process of a semiconductor device, according to some related arts, as an example of a substrate processing using a plasma, a film-forming process of depositing a predetermined film on a substrate may be performed by using a method such as a CVD (Chemical Vapor Deposition) method.

By the way, in the substrate processing using the plasma, it may be difficult to disperse (or diffuse) the plasma or an active species (which is generated by a plasma source) over an entire surface of the substrate. In particular, in a case where a plurality of substrates are accommodated (or stacked) in a multistage manner and processed in such a state, even when the plasma is supplied through edges (or side portions) of the plurality of substrates, a concentration of the active species may decrease in central portions of the plurality of substrates. As a result, a uniformity of a film formed on the surface of the substrate may deteriorate on the surface of the substrate.

SUMMARY

In order to address problems described above, according to the present disclosure, there is provided a technique capable of preventing (or suppressing) a uniformity of a film formed on a surface of a substrate from deteriorating.

According to one aspect of the technique of the present disclosure, there is provided a substrate processing apparatus including: a process chamber; a process gas supplier through which a process gas is supplied into the process chamber; an exhauster through which an inner atmosphere of the process chamber is exhausted; a plasma generating structure configured to supply a plasma into the process chamber; a boat configured to accommodate a plurality of substrates in the process chamber; a rotary shaft configured to rotatably support the boat; and an internal conductor provided inside the rotary shaft and electrically connected to the boat; wherein the boat is made of a non-metallic material, at least a part of a surface of the boat is conductive, and the boat is configured to electrically connect the internal conductor and the plurality of substrates.

BRIEF DESCRIPTION OF THE DRAWINGS

FIG. 7 is a flow chart schematically illustrating a manufacturing process of forming a silicon oxide film on a surface of a wafer by using the substrate processing apparatus shown in FIG. 1.

DETAILED DESCRIPTION

Embodiments of Present Disclosure

Figure 1:
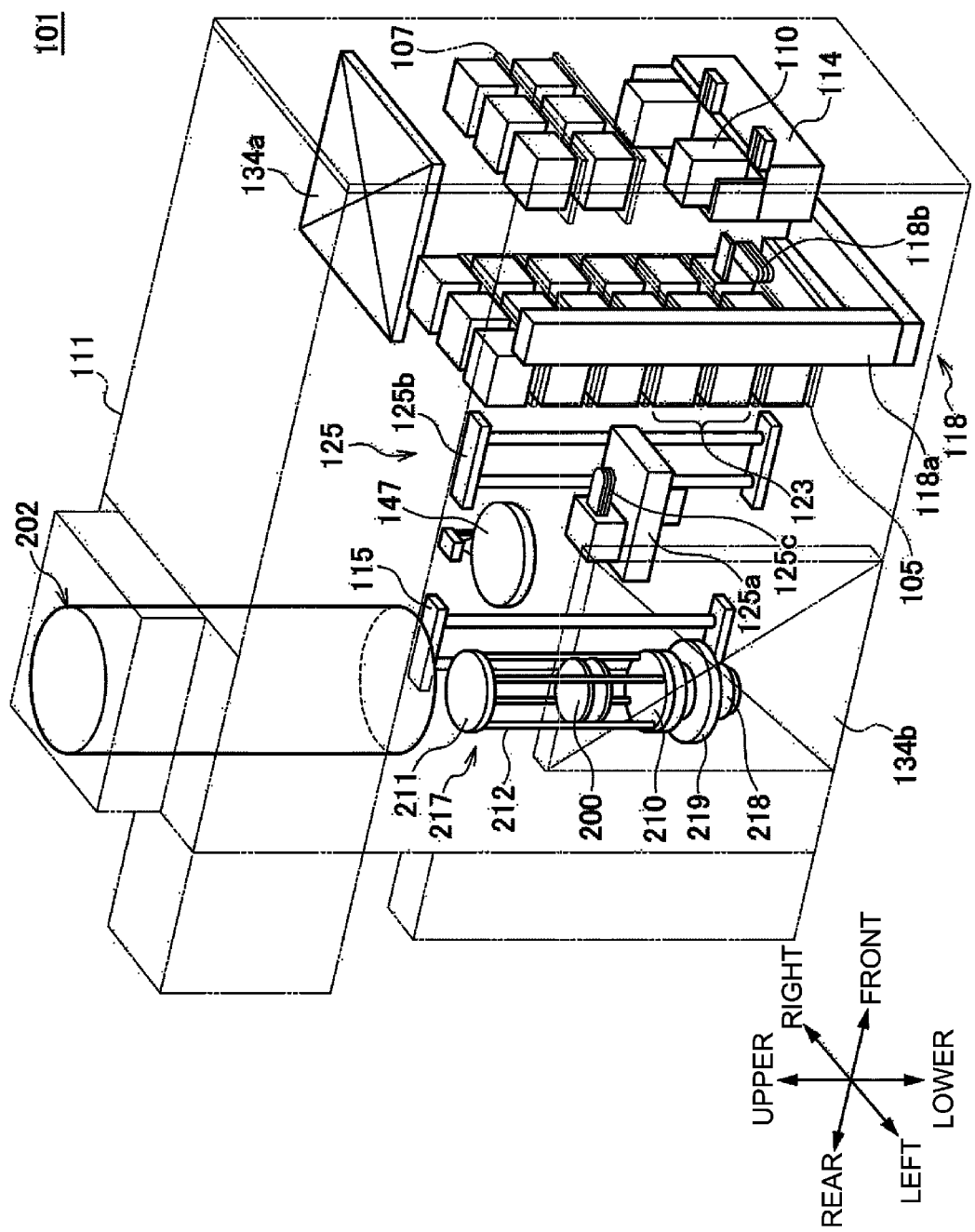
FIG. 1 is a diagram schematically illustrating a substrate processing apparatus according to one or more embodiments of the present disclosure.

Hereinafter, a substrate processing apparatus, a substrate processing method, a method of manufacturing a semiconductor device and a non-transitory computer-readable recording medium according to one or more embodiments (also simply referred to as "embodiments") of the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

<Configuration of Substrate Processing Apparatus>

As shown in FIG. 1, for example, a substrate processing apparatus 101 is configured as a semiconductor manufacturing apparatus used for manufacturing a semiconductor device. A pod 110 configured to accommodate a plurality of wafers including a wafer 200 is used in the substrate processing apparatus 101. The wafer 200 serves as an example of a substrate, and is made of a material such as semiconductor silicon. Hereinafter, the plurality of wafers including the wafer 200 may also be simply referred to as "wafers 200".

The substrate processing apparatus 101 includes a housing 111, and a pod stage 114 is installed in the housing 111. The pod 110 may be transferred (or loaded) onto or transferred (or unloaded) from the pod stage 114 by an in-process transfer device (not shown).

Further, arrows shown in FIG. 1 indicate an upper direction, a lower direction, a front direction, a rear direction, a left direction and a right direction of the substrate processing apparatus 101 (or the housing 111), respectively.

The pod 110 is placed on the pod stage 114 by the in-process transfer device (not shown). When the pod 110 is placed on the pod stage 114, the wafers 200 in the pod 110 are held (or accommodated) in a vertical orientation and a wafer loading/unloading port of the pod 110 faces upward.

The pod stage 114 is configured to rotate the pod 110 toward a rear region of the housing 111 by 90° such that the wafers 200 in the pod 110 are held (or accommodated) in a horizontal orientation and the wafer loading/unloading port of the pod 110 faces the rear region of the housing 111 of the substrate processing apparatus 101.

A pod shelf 105 is provided at a substantially central portion between a front end and a rear end of the housing 111. The pod shelf 105 is configured such that a plurality of pods including the pod 110 can be held (or accommodated) on the pod shelf 105 in a plurality of stages and a plurality of rows. A transfer shelf 123 configured to accommodate the pod 110 is provided at the pod shelf 105.

A spare pod shelf 107 is provided above the pod stage 114, and is configured such that the pod 110 is stored on the spare pod shelf 107 for preparation. A pod transfer device 118 is provided between the pod stage 114 and the pod shelf 105.

The pod transfer device 118 may include a pod elevator 118a configured to elevate and lower the pod 110 while supporting the pod 110 and a pod transfer structure 118b serving as a transfer structure. The pod transfer device 118 is configured to transfer the pod 110 among the pod stage 114, the pod shelf 105 and the spare pod shelf 107 in cooperation with of the pod elevator 118a and the pod transfer structure 118b.

A wafer transfer device 125 is provided behind the pod shelf 105. For example, the wafer transfer device 125 is constituted by a wafer transfer structure 125a and a wafer transfer structure elevator 125b. The wafer transfer structure 125a is configured to move the wafer 200 in a horizontal direction. The wafer transfer structure elevator 125b is configured to elevate and lower the wafer transfer structure 125a.

Tweezers 125c capable of picking up the wafer 200 is provided at the wafer transfer structure 125a. The wafer transfer device 125 is configured to be capable of loading (or charging) the wafer 200 into a boat 217 and unloading (or discharging) the wafer 200 out of the boat 217 in cooperation with the wafer transfer structure 125a and the wafer transfer structure elevator 125b.

A process furnace 202 in which the wafer 200 is processed by heat (that is, a heat treatment process is performed) is provided above the rear region of the housing 111, and a lower end opening of the process furnace 202 is configured to be opened and closed by a furnace opening shutter 147.

A boat elevator 115 serving as an elevating structure capable of elevating and lowering the boat 217 with respect to the process furnace 202 is provided below the process furnace 202. An arm (not shown) is connected to an elevating table (not shown) of the boat elevator 115. A seal cap 219 is provided horizontally at the arm (not shown).

The seal cap 219 is configured to be capable of supporting the boat 217 vertically and closing the lower end opening of the process furnace 202. By elevating and lowering the seal cap 219 by the boat elevator 115, the boat 217 supported by the seal cap 219 can be loaded into or unloaded out of a process chamber 201. Further, the wafers 200 accommodated in the boat 217 are heated to a predetermined temperature by a heater 207 described later while being inserted into the process chamber 201.

For example, the boat 217 is made of a non-metallic material. The boat 217 is configured such that the wafers 200 (for example, 50 wafers to 150 wafers) are capable of being accommodated (or supported) in the boat 217 while the wafers 200 are horizontally oriented with a predetermined interval (equal interval) therebetween in an upper and lower direction (that is, a vertical direction). Further, the boat 217 supports (or accommodates) the wafers 200 such that centers of the wafers 200 are coaxially aligned with one another.

A clean air supplier (which is a clean air supply structure) 134a configured to supply clean air such as a clean atmosphere is provided above the pod shelf 105. A clean air supplier (which is a clean air supply structure) 134b configured to supply the clean air is provided at a left end of the housing 111.

<Configuration of Process Furnace>

Subsequently, a configuration of the process furnace 202 of the substrate processing apparatus 101 will be described in detail.

Figure 2:
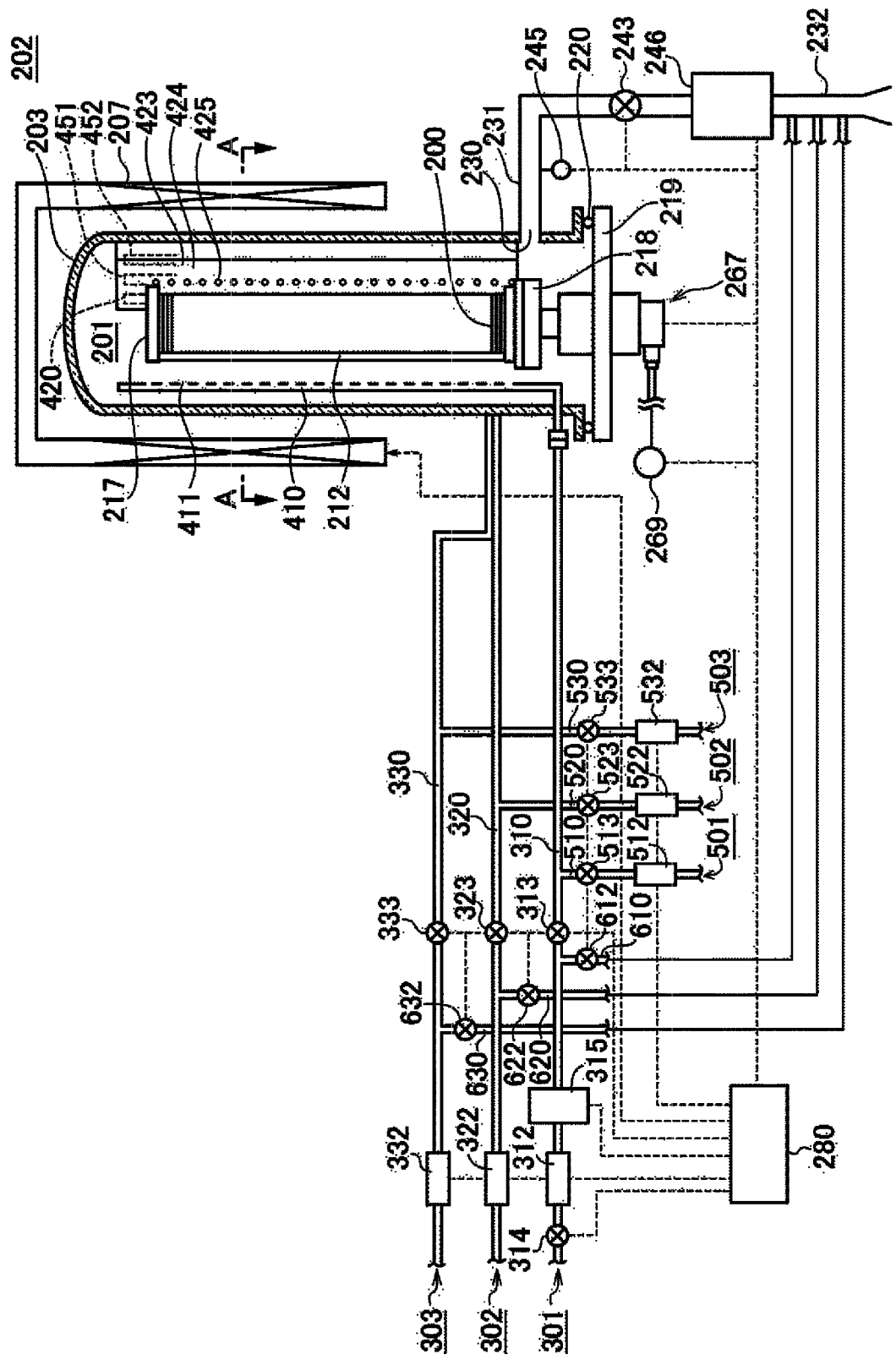
FIG. 2 is a diagram schematically illustrating a vertical cross-section (taken along a line B-B shown in FIG. 4) of a process furnace of the substrate processing apparatus shown in FIG. 1.

As shown in FIG. 2, the process furnace 202 is provided with the heater 207 serving as a heating apparatus (heating structure) capable of heating the wafers 200. The heater 207 includes a cylindrical heat insulator whose upper end is closed and a plurality of heater wires provided at the heat insulator. A reaction tube 203 made of quartz is provided at an inner side of the heater 207 in a manner concentric with the heater 207.

The seal cap 219 serving as a furnace opening lid capable of airtightly sealing (or closing) a lower end opening of the reaction tube 203 is provided under the reaction tube 203. The seal cap 219 is in contact with a lower end of the reaction tube 203 from thereunder. For example, the seal cap 219 is made of a metal such as SUS (stainless steel), and is of a disk shape.

A flange (not shown) of an annular shape is provided at the lower end of the reaction tube 203. An airtight seal (hereinafter, also referred to as an "O-ring") 220 is provided between a lower surface of the flange and an upper surface of the seal cap 219. The O-ring 220 airtightly seals a gap between the flange and the seal cap 219.

The process chamber 201 according to the present embodiments is constituted by the reaction tube 203 and the seal cap 219.

As shown in FIG. 1, the boat 217 accommodating (or supporting) the wafers 200 is arranged above the seal cap 219. The boat 217 is supported by a boat support base 218 described later. The boat 217 includes a bottom plate 210, a top plate 211, a plurality of support columns 212 and a plurality of electrode plates 214 (see FIG. 3). The plurality of support columns 212 are provided vertically on the bottom plate 210. The top plate 211 is provided at upper ends of the plurality of support columns 212.

Figure 3:
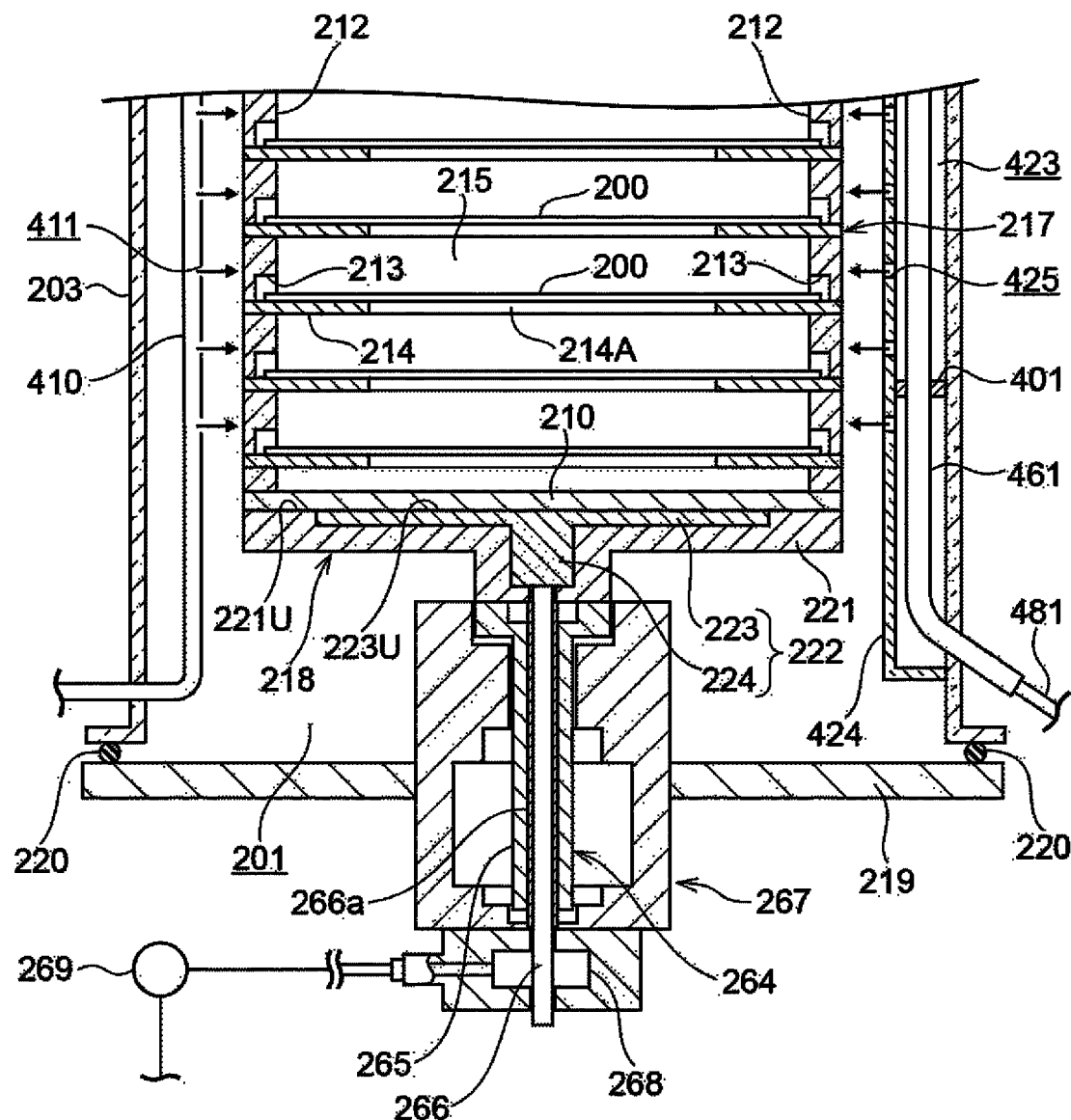
FIG. 3 is a diagram schematically illustrating vertical cross-sections of a boat and a boat rotator of the process furnace shown in FIG. 2.

As shown in FIG. 3, the plurality of electrode plates 214 are provided on the plurality of support columns 212. Each of the plurality of electrode plates 214 is of a ring shape. Further, a through-hole 214A is provided in a central portion of the plurality of electrode plates 214. The plurality of electrode plates 214 are supported by the plurality of support columns 212 while the plurality of electrode plates 214 are horizontally oriented with a predetermined interval therebetween in the vertical direction. The wafers 200 are placed on upper surfaces of the plurality of electrode plates 214, respectively.

Each of the plurality of support columns 212 is provided with a plurality of support grooves 213. Outer edges (outer peripheral portions) of the wafers 200 are inserted into the plurality of support grooves 213, respectively. The plurality of support grooves 213 are arranged adjacent to upper surfaces of outer edges (outer peripheral portions) of the plurality of electrode plates 214, respectively. As a result, the upper surfaces of the outer edges of the plurality of electrode plates 214 are exposed in the plurality of support grooves 213, respectively. When the outer edges of the wafers 200 are inserted into the plurality of support grooves 213, respectively, the outer edges of the wafers 200 are placed on the upper surfaces of the plurality of electrode plates 214, respectively. Further, when the outer edges of the wafers 200 are placed on the upper surfaces of the outer edges of the plurality of electrode plates 214, respectively, the through-hole 214A of the plurality of electrode plates 214 is closed by the wafers 200. Thereby, a plurality of process spaces 215 are provided between the vertically adjacent wafers among the wafers 200. A process gas and a plasma, which will be described later, are supplied to each of the plurality of process spaces 215.

The bottom plate 210, the plurality of support columns 212, and the plurality of electrode plates 214 that constitute the boat 217 are made of, for example, doped silicon carbide which is conductive and heat resistant. Accordingly, when the wafers 200 are respectively placed on the plurality of electrode plates 214, the boat 217 and the wafers 200 can be electrically connected (to enable electric conduction) to each other.

It is sufficient that the boat 217 is configured such that at least a back surface of the bottom plate 210 is electrically conductive with the plurality of electrode plates 214, or a part of a surface of the boat 217 is electrically conductive. Therefore, for example, the boat 217 may be formed by coating a surface of a heat resistant material such as quartz and silicon carbide with a conductive metal coating of a high melting point. Further, the plurality of electrode plates 214 and the top plate 211 may be omitted. In particular, when back surfaces of the wafers 200 enable electric conduction due to Ohmic contacts or tunneling effects, the wafers 200 can be placed directly on the plurality of support grooves 213, respectively.

The seal cap 219 is provided with a boat rotator (which is a boat rotating structure) 267 capable of rotating the boat 217. The boat rotator 267 may include a rotating shaft 264 and a drive source (not shown) such as a motor capable of rotating the rotating shaft 264. The rotating shaft 264 penetrates the seal cap 219 in the vertical direction. The rotating shaft 264 may be arranged inside and outside the process chamber 201 such that the rotating shaft 264 can be connected to a body of the boat rotator 267 via a bearing (not shown). Further, for example, a gap between the rotating shaft 264 and the body of the boat rotator 267 may be sealed with a magnetic fluid.

The rotating shaft 264 may be constituted by a tubular rotary shaft 265, an internal conductor 266 and an insulator tube 266a. The tubular rotary shaft 265 is of a cylindrical shape. For example, the tubular rotary shaft 265 is made of a metal such as a ferromagnetic metal, and is mechanically connected to the boat support base 218 to transmit a rotation. The internal conductor 266 is provided inside the tubular rotary shaft 265.

For example, the internal conductor 266 is of a columnar shape, and is made of a material such as a conductive metal. Further, the internal conductor 266 is concentrically arranged inside the tubular rotary shaft 265, and an upper end of the internal conductor 266 protrudes further than an upper surface of the tubular rotary shaft 265. For example, the insulator tube 266a is made of a material such as alumina, and is provided between the tubular rotary shaft 265 and the internal conductor 266 to electrically insulate the tubular rotary shaft 265 and the internal conductor 266. A part of an inner peripheral portion and a part of an outer peripheral portion of the insulator tube 266a are deposited with a metal, integrated with the inner conductor 266 and the tubular rotary shaft 265 by brazing, and sealed. Further, a DC (direct current) power supply 269 is electrically connected to a lower portion of the internal conductor 266 via a slip ring 268. As a result, a voltage (DC bias) is stably supplied from the DC power supply 269 to the internal conductor 266 (which is being rotated) via the slip ring 268. For example, the DC power supply 269 is configured to be capable of generating a voltage within a range from −10 kV to 10 kV, and the voltage can be controlled by a controller 280 described later.

The boat support base 218 capable of supporting the boat 217 is provided at an upper end of the rotating shaft 264 (that is, the tubular rotary shaft 265). The boat support base 218 is rotatable integrally with the rotating shaft 264. The bottom plate 210 of the boat 217 is fixed to an upper surface of the boat support base 218. Thereby, by rotating the rotating shaft 264, the boat support base 218 and the boat 217 are rotated together.

The boat support base 218 is located above the seal cap 219. The boat support base 218 may include an insulating structure 221 and a metal structure 222. For example, the insulating structure 221 is of a disk shape. Further, the insulating structure 221 is made of an insulating and heat resistant material such as quartz and silicon carbide. A recess (which is a concave portion) is provided in an upper surface 221U of the insulating structure 221. The metal structure 222 is fitted in the recess described above, and a lower surface of the bottom plate 210 of the boat 217 is fixed to the upper surface 221U.

For example, the metal structure 222 is made of a conductive metal (high melting point metal). The metal structure 222 has a contact portion 223 and a connection portion 224. For example, the contact portion 223 is of a disk shape. The contact portion 223 is embedded in an upper portion of the insulating structure 221. Further, an upper surface of the contact portion 223 is exposed from the upper surface 221U of the insulating structure 221, and serves as a contact surface 223U contacting with the lower surface of the bottom plate 210 of the boat 217. By contacting the lower surface of the bottom plate 210 with the contact surface 223U of the contact portion 223, the boat 217 and the metal structure 222 are electrically connected (to enable electric conduction) to each other.

Further, the contact surface 223U of the contact portion 223 is set to be smaller than the lower surface of the bottom plate 210 of the boat 217. Thereby, an entirety of the contact surface 223U of the contact portion 223 can be covered with the lower surface of the bottom plate 210. Thereby, it is possible to protect the contact surface 223U of the contact portion 223 from a substance such as the process gas and the plasma (which are described later) by the lower surface of the bottom plate 210.

For example, the connection portion 224 is of a cylindrical shape. The connection portion 224 extends downward from a lower surface of the contact portion 223, and is electrically connected (or conducted) to an upper end portion of the internal conductor 266. Thereby, the wafers 200 supported by the boat 217 and the internal conductors 266 are electrically connected to each other via the metal structure 222. In the present specification, the term "electrically connected" is not limited to a case where the wafer 200 is electrically conductive, but the term "electrically connected" may be used as long as some conductor leading from the inner conductor 266 reaches the wafer 200.

Figure 4:
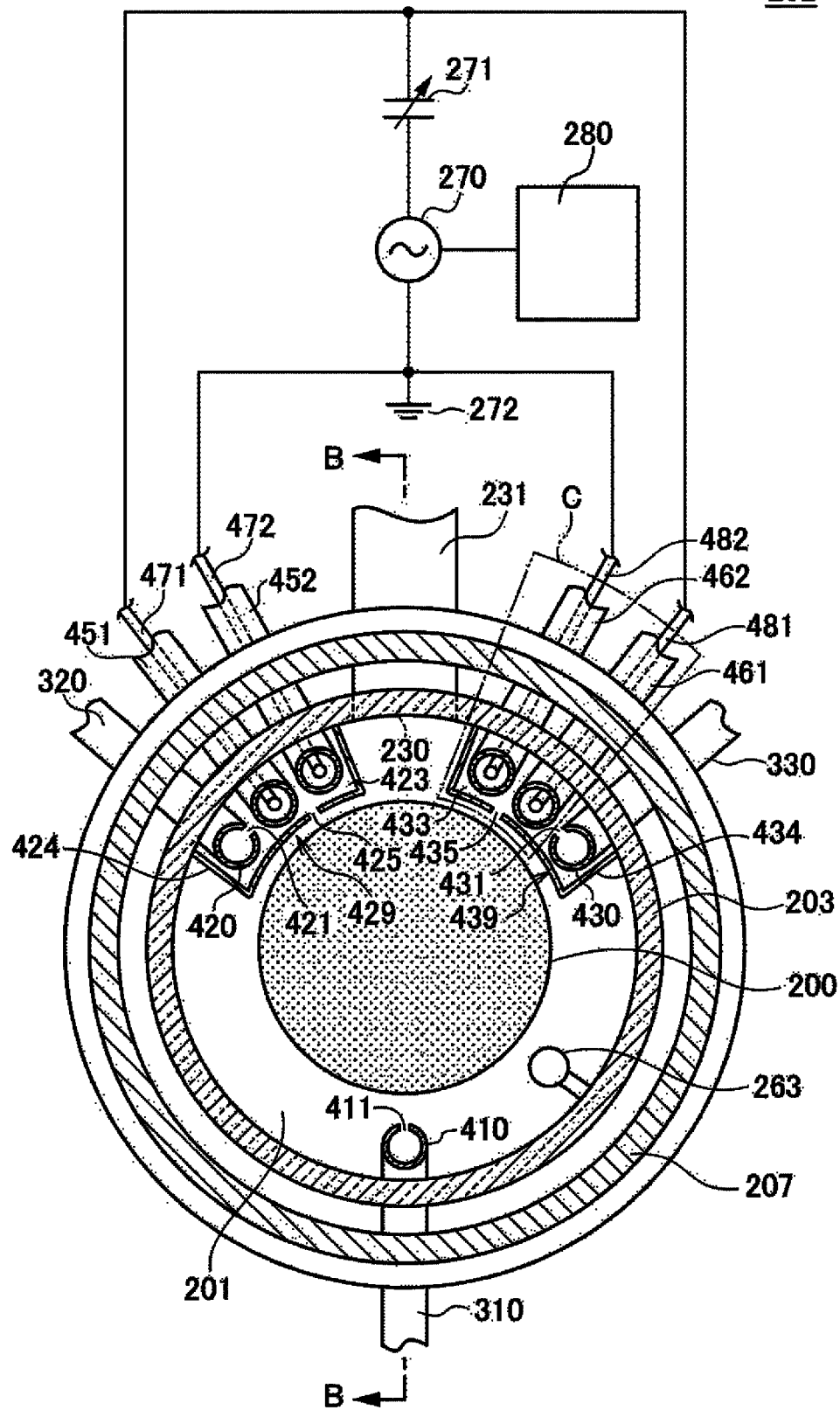
FIG. 4 is a diagram schematically illustrating a horizontal cross-section (taken along a line A-A shown in FIG. 2) of the process furnace shown in FIG. 2.

As shown in FIG. 4, three gas supply pipes 310, 320 and 330 through which the process gas such as a source gas is supplied are connected to the process chamber 201.

Nozzles 410, 420 and 430 are provided in the process chamber 201. The nozzles 410, 420 and 430 are provided so as to penetrate a lower portion of the reaction tube 203. The gas supply pipe 310 is connected to the nozzle 410, the gas supply pipe 320 is connected to the nozzle 420 and the gas supply pipe 330 is connected to the nozzle 430.

<Process Gas Supplier 301>

As shown in FIG. 2, a valve 314 serving as an opening/closing valve, a liquid mass flow controller 312 serving as a flow rate controller for a liquid source, a vaporizer 315 serving as a vaporizing structure (vaporizing apparatus) and a valve 313 serving as an opening/closing valve are sequentially provided at the gas supply pipe 310 in this order from an upstream side to a downstream side of the gas supply pipe 310 in a gas flow direction.

A downstream end of the gas supply pipe 310 is connected to a lower end portion of the nozzle 410. The nozzle 410 extends in the vertical direction along an inner wall of the reaction tube 203. A plurality of gas supply holes 411 through which the process gas such as the source gas is supplied to the wafers 200 are provided on a side surface of the nozzle 410.

As shown in FIG. 3, the plurality of gas supply holes 411 are open on the side surface of the nozzle 410 so as to face the wafers 200 inserted in the reaction tube 203. Further, the plurality of gas supply holes 411 are arranged with a predetermined interval therebetween in the vertical direction so as to face the plurality of process spaces 215 provided in the boat 217. Thereby, it is possible to supply the process gas to the plurality of process spaces 215 through the plurality of gas supply holes 411.

As shown in FIG. 2, a vent line 610 and a valve 612 connected to an exhaust pipe 232 described later are provided at the gas supply pipe 310 between the valve 313 and the vaporizer 315. According to the present embodiments, a process gas supplier (which is a process gas supply structure or a process gas supply system) 301 is constituted mainly by the gas supply pipe 310, the valve 314, the liquid mass flow controller 312, the vaporizer 315, the valve 313, the nozzle 410, the vent line 610 and the valve 612.

A carrier gas supply pipe 510 through which a carrier gas such as an inert gas is supplied is connected to the gas supply pipe 310 at a downstream side of the valve 313. A mass flow controller 512 and a valve 513 are provided at the carrier gas supply pipe 510. According to the present embodiments, a carrier gas supplier (which is a carrier gas supply structure or a carrier gas supply system) 501 is constituted mainly by the carrier gas supply pipe 510, the mass flow controller 512 and the valve 513. The carrier gas supplier 501 may also be referred to as an "inert gas supplier 501" which is an inert gas supply structure or an inert gas supply system.

In the process gas supplier 301, a flow rate of the liquid source is adjusted by the liquid mass flow controller 312, and the liquid source whose flow rate is adjusted is supplied to the vaporizer 315. Then, the liquid source vaporized by the vaporizer 315 is supplied to the gas supply pipe 310 as the process gas.

While the process gas is not being supplied to the process chamber 201, with the valve 313 closed and the valve 612 open, the process gas flows (or is supplied) to the vent line 610 through the valve 612.

When the process gas is supplied to the process chamber 201, with the valve 612 closed and the valve 313 open, the process gas is supplied to the gas supply pipe 310. In addition, in the carrier gas supplier 501, a flow rate of the carrier gas is adjusted by the mass flow controller 512, and the carrier gas whose flow rate is adjusted is supplied through the carrier gas supply pipe 510 via the valve 513. The process gas (source gas) and the carrier gas join in the gas supply pipe 310 at the downstream side of the valve 313, and the source gas together with the carrier gas is supplied to the process chamber 201 through the nozzle 410.

<Gas Supplier 302>

As shown in FIG. 2, a mass flow controller 322 serving as a flow rate controller and a valve 323 serving as an opening/closing valve are sequentially provided at the gas supply pipe 320 in this order from an upstream side to a downstream side of the gas supply pipe 320 in the gas flow direction. A vent line 620 and a valve 622 connected to the exhaust pipe 232 described later are provided at the gas supply pipe 320 between the valve 323 and the mass flow controller 322. According to the present embodiments, a gas supplier (which is a gas supply structure or a gas supply system) 302 is constituted mainly by the gas supply pipe 320, the mass flow controller 322, the valve 323, the nozzle 420, a buffer chamber 423, the vent line 620 and the valve 622. A downstream end of the gas supply pipe 320 is connected to a lower end portion of the nozzle 420.

The nozzle 420 is provided in the buffer chamber 423 serving as a gas dispersion space (also referred to as a "discharge chamber" or a "discharge space"). Electrode protection pipes 451 and 452 described later are provided in the buffer chamber 423. The nozzle 420, the electrode protection pipe 451 and the electrode protection pipe 452 are arranged sequentially in this order in the buffer chamber 423.

As shown in FIG. 4, the buffer chamber 423 is defined by the inner wall of reaction tube 203 and a buffer chamber wall 424. The buffer chamber wall 424 extends in the vertical direction along the inner wall of the reaction tube 203. A horizontal cross-section of the buffer chamber wall 424 is of a "C" shape. The buffer chamber wall 424 extends from a lower portion to an upper portion of the inner wall of the reaction tube 203.

The buffer chamber wall 424 is provided with a wall facing the wafers 200 inserted into the reaction tube 203. Hereinafter, the wall of the buffer chamber wall 424 facing the wafers 200 may also be referred to as an "opposing wall". The opposing wall is provided with a plurality of gas supply holes 425 through which the plasma is supplied to the wafers 200. The plurality of gas supply holes 425 are open in the opposing wall between the electrode protection pipe 451 and the electrode protection pipe 452.

As shown in FIGS. 3 and 4, the plurality of gas supply holes 425 are open in the opposing wall so as to face the wafers 200. The plurality of gas supply holes 425 are arranged with a predetermined interval therebetween in the vertical direction so as to face the plurality of process spaces 215. Thereby, it is possible to supply the plasma to the plurality of process spaces 215 through the plurality of gas supply holes 425. For example, opening areas of the gas supply holes 425 are the same, and the plurality of gas supply holes 425 are provided with the same opening pitch therebetween.

As shown in FIG. 4, the nozzle 420 is arranged at an end of the buffer chamber 423. The nozzle 420 extends in the vertical direction along the inner wall of the reaction tube 203. A plurality of gas supply holes 421 through which a gas such as an oxygen-containing gas described later is ejected are provided on a side surface of the nozzle 420. The plurality of gas supply holes 421 are open in the side surface of the nozzle 420 so as to face a center of the buffer chamber 423.

Similar to the plurality of gas supply holes 425 of the buffer chamber 423, the plurality of gas supply holes 421 are arranged with a predetermined interval therebetween in the vertical direction. For example, opening areas of the gas supply holes 421 are the same from an upstream side (which is a lower portion) to a downstream side (which is an upper portion) of the nozzle 420, and the plurality of gas supply holes 421 are provided with the same opening pitch therebetween from the upstream side to the downstream side of the nozzle 420. Alternatively, the opening area of each of the gas supply holes 421 may be gradually increased as it goes from the upstream side to the downstream side of the nozzle 420, or the opening pitch of each of the gas supply holes 421 may be gradually decreased as it goes from the upstream side to the downstream side of the nozzle 420.

By adjusting the opening area and the opening pitch of each of the gas supply holes 421 as described above, the gas is ejected through the plurality of gas supply holes 421 with substantially the same flow rate. Thereby, even when the gas is ejected through the plurality of gas supply holes 421 with different flow velocities, the flow rates and the flow velocities of the gas introduced into the process chamber 201 can be uniformized when the gas is ejected through the plurality of the gas supply holes 425.

Returning to FIG. 2, a carrier gas supply pipe 520 through which the carrier gas such as the inert gas is supplied is connected to the gas supply pipe 320 at a downstream side of the valve 323. A mass flow controller 522 and a valve 523 are provided at the carrier gas supply pipe 520. According to the present embodiments, a carrier gas supplier (which is a carrier gas supply structure or a carrier gas supply system) 502 is constituted mainly by the carrier gas supply pipe 520, the mass flow controller 522 and the valve 523. The carrier gas supplier 502 may also be referred to as an "inert gas supplier 502" which is an inert gas supply structure or an inert gas supply system.

A flow rate of a source gas in a gaseous state such as the oxygen-containing gas is adjusted by the mass flow controller 322, and the source gas in the gaseous state whose flow rate is adjusted is supplied through the gas supply pipe 320.

While the process gas (that is, the source gas in the gaseous state such as the oxygen-containing gas) is not being supplied to the process chamber 201, with the valve 323 closed and the valve 622 open, the process gas flows (or is supplied) to the vent line 620 through the valve 622.

When the process gas (that is, the source gas in the gaseous state such as the oxygen-containing gas) is supplied to the process chamber 201, with the valve 622 closed and the valve 323 open, the process gas is supplied to the gas supply pipe 320. In addition, in the carrier gas supplier 502, the flow rate of the carrier gas is adjusted by the mass flow controller 522, and the carrier gas whose flow rate is adjusted is supplied through the carrier gas supply pipe 520 via the valve 523. The process gas (that is, the source gas in the gaseous state such as the oxygen-containing gas) and the carrier gas join in the gas supply pipe 320 at the downstream side of the valve 323, and the process gas together with the carrier gas is supplied to the process chamber 201 through the nozzle 420 and the buffer chamber 423.

<Gas Supplier 303>

A configuration of a gas supplier (which is a gas supply structure or a gas supply system) 303 is basically the same as that of the gas supplier 302. As shown in FIG. 2, a mass flow controller 332 serving as a flow rate controller and a valve 333 serving as an opening/closing valve are sequentially provided at the gas supply pipe 330 in this order from an upstream side to a downstream side of the gas supply pipe 330 in the gas flow direction. A vent line 630 and a valve 632 connected to the exhaust pipe 232 described later are provided at the gas supply pipe 330 between the valve 333 and the mass flow controller 332. According to the present embodiments, the gas supplier 303 is constituted mainly by the gas supply pipe 330, the mass flow controller 332, the valve 333, the nozzle 430, a buffer chamber 433, the vent line 630 and the valve 632. A downstream end of the gas supply pipe 330 is connected to a lower end portion of the nozzle 430.

The nozzle 430 is provided in the buffer chamber 433 serving as a gas dispersion space (also referred to as a "discharge chamber" or a "discharge space"). Electrode protection pipes 461 and 462 described later are provided in the buffer chamber 433. The nozzle 430, the electrode protection pipe 461 and the electrode protection pipe 462 are arranged sequentially in this order in the buffer chamber 433. As will be described later, the buffer chamber 433 (and an internal configuration thereof) is in a plane symmetry with respect to the buffer chamber 423 (and an internal configuration thereof). Thus, detailed descriptions of the buffer chamber 433 (and the internal configuration thereof) will be omitted.

The buffer chamber 433 is defined by the inner wall of reaction tube 203 and a buffer chamber wall 434. The buffer chamber wall 434 extends in the vertical direction along the inner wall of the reaction tube 203. A horizontal cross-section of the buffer chamber wall 434 is of a "C" shape.

The buffer chamber wall 434 is provided with a wall facing the wafers 200 inserted into the reaction tube 203. Hereinafter, the wall of the buffer chamber wall 434 facing the wafers 200 may also referred to as an "opposing wall". The opposing wall is provided with a plurality of gas supply holes 435 through which the plasma is supplied to the wafers 200. The plurality of gas supply holes 435 are open in the opposing wall between the electrode protection pipe 461 and the electrode protection pipe 462.

The plurality of gas supply holes 435 are open in the opposing wall so as to face the wafers 200. The plurality of gas supply holes 435 are arranged with a predetermined interval therebetween in the vertical direction so as to face the plurality of process spaces 215.

The nozzle 430 is arranged at an end of the buffer chamber 433. The nozzle 430 extends in the vertical direction along the inner wall of the reaction tube 203. A plurality of gas supply holes 431 through which the gas such as the oxygen-containing gas described later is ejected are provided on a side surface of the nozzle 430 with a predetermined interval therebetween in the vertical direction. The plurality of gas supply holes 431 are open in the side surface of the nozzle 430 so as to face a center of the buffer chamber 433.

Returning to FIG. 2, a carrier gas supply pipe 530 through which the carrier gas such as the inert gas is supplied is connected to the gas supply pipe 330 at a downstream side of the valve 333. A mass flow controller 532 and a valve 533 are provided at the carrier gas supply pipe 530. According to the present embodiments, a carrier gas supplier (which is a carrier gas supply structure or a carrier gas supply system) 503 is constituted mainly by the carrier gas supply pipe 530, the mass flow controller 532 and the valve 533. The carrier gas supplier 503 may also be referred to as an "inert gas supplier 503" which is an inert gas supply structure or an inert gas supply system. A configuration of the carrier gas supplier 503 is basically the same as that of the carrier gas supplier 502.

The source gas in the gaseous state whose flow rate is adjusted by the mass flow controller 332 is supplied through the gas supply pipe 330.

<Remote Plasma Source>

As shown in FIG. 4, in the buffer chamber 423, a rod-shaped electrode 471 and a rod-shaped electrode 472 (which are formed as a thin and elongated structure) are provided. The rod-shaped electrode 471 and the rod-shaped electrode 472 extend in the vertical direction from a lower portion to an upper portion of the reaction tube 203. The rod-shaped electrode 471 and the rod-shaped electrode 472 are provided substantially parallel to the nozzle 420. The rod-shaped electrode 471 and the rod-shaped electrode 472 are covered and protected by the electrode protection pipe 451 and the electrode protection pipe 452, respectively.

The rod-shaped electrode 471 is connected to a high frequency (RF: Radio Frequency) power supply 270 via a matcher (which is a matching structure) 271. The rod-shaped electrode 472 is connected to an electrical ground 272 serving as a reference potential. By applying a high frequency power (RF power) to the rod-shaped electrode 471 from the high frequency power supply 270, the plasma is generated in a plasma generation region between the rod-shaped electrode 471 and the rod-shaped electrode 472.

According to the present embodiments, a first remote plasma generating structure 429 is constituted mainly by the rod-shaped electrode 471, the rod-shaped electrode 472, the electrode protection pipe 451, the electrode protection pipe 452, the buffer chamber 423 and the plurality of gas supply holes 425. In addition, according to the present embodiments, a first remote plasma source serving as a plasma generator (which is a plasma generating apparatus) is constituted mainly by the rod-shaped electrode 471, the rod-shaped electrode 472, the electrode protection pipe 451, the electrode protection pipe 452, the matcher 271 and the high frequency power supply 270. The first remote plasma source also functions as an activator capable of activating the gas into a plasma state. The buffer chamber 423 also functions as a plasma generation chamber.

In the buffer chamber 433, a rod-shaped electrode 481 and a rod-shaped electrode 482 (which are formed as a thin and elongated structure) are provided. The rod-shaped electrode 481 and the rod-shaped electrode 482 extend in the vertical direction from the lower portion to the upper portion of the reaction tube 203. The rod-shaped electrode 481 and the rod-shaped electrode 482 are provided substantially parallel to the nozzle 430. The rod-shaped electrode 481 and the rod-shaped electrode 482 are covered and protected by the electrode protection pipe 461 and the electrode protection pipe 462, respectively.

The rod-shaped electrode 481 is connected to the high frequency power supply 270 via the matcher 271. The rod-shaped electrode 482 is connected to the electrical ground 272 serving as the reference potential. By applying the high frequency power to the rod-shaped electrode 481 from the high frequency power supply 270, the plasma is generated in a plasma generation region between the rod-shaped electrode 481 and the rod-shaped electrode 482.

According to the present embodiments, a second remote plasma generating structure 439 is constituted mainly by the rod-shaped electrode 481, the rod-shaped electrode 482, the electrode protection pipe 461, the electrode protection pipe 462, the buffer chamber 433 and the plurality of gas supply holes 435. In addition, according to the present embodiments, a second remote plasma source serving as a plasma generator (which is a plasma generating apparatus) is constituted mainly by the rod-shaped electrode 481, the rod-shaped electrode 482, the electrode protection pipe 461, the electrode protection pipe 462, the matcher 271 and the high frequency power supply 270. The second remote plasma source also functions as an activator capable of activating the gas into the plasma state. The buffer chamber 433 also functions as a plasma generation chamber.

Figure 5:
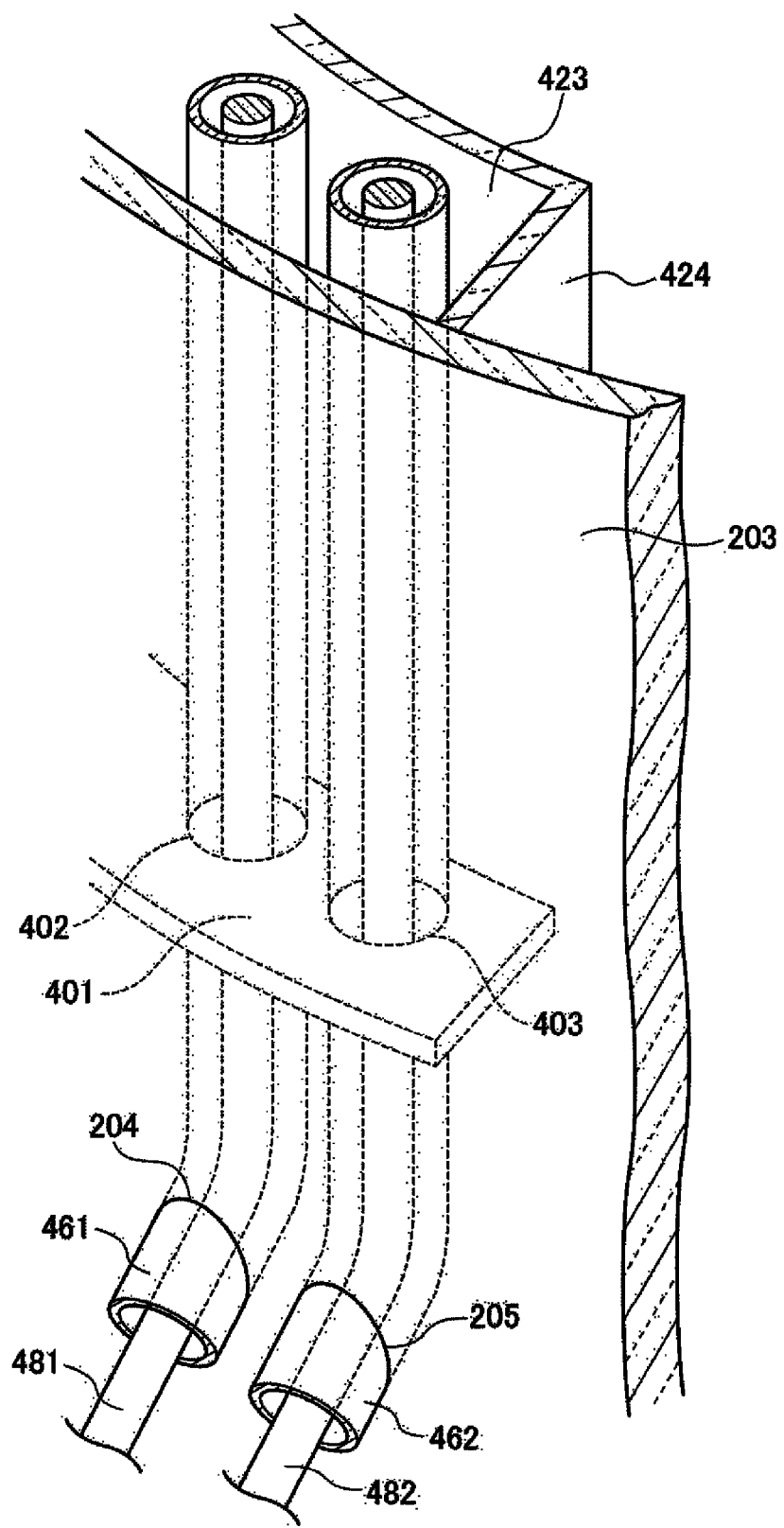
FIG. 5 is a diagram schematically illustrating a "C" region shown in FIG. 4.

As shown in FIG. 5, the electrode protection pipe 461 and the electrode protection pipe 462 are inserted into the buffer chamber 423 through a through-hole 204 and a through-hole 205 provided in the reaction tube 203 adjacent to a lower portion of the boat support base 218, respectively. The electrode protection pipe 461 and the electrode protection pipe 462 are fixed to the reaction tube 203 through the through-hole 204 and the through-hole 205, respectively. The electrode protection pipe 461 and the electrode protection pipe 462 are fixed to a mounting plate 401 provided in the buffer chamber 423 while penetrating through holes 402 and 403 of the mounting plate 401 provided in the buffer chamber 423, respectively. The mounting plate 401 is fixed to the reaction tube 203 and the buffer chamber wall 424.

Configurations of the electrode protection pipe 451 and the electrode protection pipe 452 are substantially the same as those of the electrode protection pipe 461 and the electrode protection pipe 462, respectively.

As shown in FIG. 4, inner spaces of the electrode protection pipe 451 and the electrode protection pipe 452 are isolated from an inner atmosphere of the buffer chamber 423. Similarly, inner spaces of the electrode protection pipe 461 and the electrode protection pipe 462 are isolated from an inner atmosphere of the buffer chamber 433.

For example, the rod-shaped electrodes 471, 472, 481 and 482 inserted in the electrode protection pipes 451, 452, 461 and 462, respectively, may be oxidized by a heat of the heater 207. Therefore, each of the electrode protection pipes 451, 452, 461 and 462 is provided with an inert gas purge structure in order to suppress an oxidation of each of the rod-shaped electrodes 471, 472, 481 and 482.

The inert gas purge structure fills or purges the inner spaces of the electrode protection pipes 451, 452, 461 and 462 with an inert gas such as nitrogen so as to reduce an oxygen concentration in the electrode protection pipes 451, 452, 461 and 462. Thereby, it is possible to suppress the oxidation of each of the rod-shaped electrodes 471, 472, 481 and 482.

For example, a remote plasma method is used in a substrate processing of the present embodiments. When the wafer 200 is processed by using the remote plasma method, the plasma generated in the buffer chambers 423 and 433 separated from the process chamber 201 is supplied to the process chamber 201, and the wafer 200 in the process chamber 201 is processed by the plasma. According to the present embodiments, the two rod-shaped electrodes 471 and 472 are accommodated in the buffer chamber 423, and the two rod-shaped electrodes 481 and 482 are accommodated in the buffer chamber 433. Since the rod-shaped electrodes 472 and 482 are grounded and fed with an unbalanced power, most of electric lines of the force extending from the rod-shaped electrodes 471 and 481 are directed to the rod-shaped electrodes 472 and 482. However, some of the electric lines of the force extending from the rod-shaped electrodes 471 and 481 are directed to a cover of the heater 207 and the housing 111 (which are grounded).

As a result, a region with a strong electric field is formed so as to surround the two rod-shaped electrodes 471 and 472

(more specifically, the region with the strong electric field is formed so as to surround the electrode protection pipes 451 and 452), and the plasma is generated in the region with the strong electric field. Similarly, a region with a strong electric field is formed so as to surround the two rod-shaped electrodes 481 and 482 (more specifically, the region with the strong electric field is formed so as to surround the electrode protection pipes 461 and 462), and the plasma is generated in the region with the strong electric field. That is, the gas supplied through the nozzles 420 and 430 and then filling the buffer chambers 423 and 433 is converted into the plasma state (that is, the plasma). Thereby, an active species (which is a plasma active species) can be generated. Further, a weak electric field is also generated in locations other than the buffer chambers 423 and 433 in the process chamber 201, and a small amount of the plasma may be generated. Such a method described above may also be referred to as a "soft plasma method". The active species generated as described above can reach (or be supplied to) surfaces of the wafers 200.

By providing the buffer chambers 423 and 433 on a surface of the inner wall of the reaction tube 203 and by using the soft plasma method, according to the present embodiments, as compared with a case where the buffer chambers 423 and 433 are provided on a surface of an outer wall of the reaction tube 203 or a case where the and the soft plasma method is not used, the plasma active species can reach the surfaces of the wafers 200 without being deactivated.

For example, in order to lower a process temperature of the wafer 200 when the wafer 200 is processed by using the plasma, the high frequency power when generating the plasma should be increased. However, when the high frequency power when generating the plasma is increased, a damage to the wafer 200 or to a film to be formed on the surface of the wafer 200 may also be increased.

On the other hand, as shown in FIG. 4, in the substrate processing apparatus 101 according to the present embodiments, two remote plasma generating structures (that is, the first remote plasma generating structure 429 and the second remote plasma generating structure 439) are provided. Therefore, according to the present embodiments, even when the high frequency power supplied to each of the first remote plasma generating structure 429 and the second remote plasma generating structure 439 is small, it is possible to generate a sufficient amount of the plasma as compared to a case where one remote plasma generating structure is provided. As a result, according to the present embodiments, when the wafer 200 is processed by using the plasma, it is possible to reduce the damage to the wafer 200 or the film to be formed on the surface of the wafer 200. In addition, according to the present embodiments, it is also possible to lower the process temperature of the wafer 200.

In addition, the first remote plasma generating structure 429 and the second remote plasma generating structure 439 are arranged in a plane symmetry with respect to a vertical plane passing through the center of the wafer 200 (or a center of the reaction tube 203). Thereby, it is possible to more uniformly supply the plasma to upper surfaces of the wafers 200 by using the first remote plasma generating structure 429 and the second remote plasma generating structure 439. As a result, it is possible to form the film more uniformly on the surfaces (that is, the upper surfaces) of the wafers 200.

Further, an exhaust port 230 is provided on a horizontal line passing through the center of the wafer 200 (or the center of the reaction tube 203). Thereby, it is possible to more uniformly supply the plasma to an entirety of the upper surface of the wafer 200. In addition, the plurality of gas supply holes 411 of the nozzle 410 are also provided on lines passing through the centers of the wafers 200 (or the center of the reaction tube 203), respectively. Thereby, it is possible to more uniformly supply the source gas to the entirety of the upper surfaces of the wafers 200. As a result, it is possible to form the film more uniformly on the upper surfaces of the wafers 200.

Further, distances from the plurality of gas supply holes 411 of the nozzle 410 to the plurality of gas supply holes 425 of the buffer chamber 423 are set to be equal to distances from the plurality of gas supply holes 411 of the nozzle 410 to the plurality of gas supply holes 435 of the buffer chamber 433. Thereby, it is possible to form the film more uniformly on the upper surfaces of the wafers 200.

As shown in FIG. 2, an exhaust pipe 231 through which an inner atmosphere of the process chamber 201 is exhausted is connected to the exhaust port 230 provided at the lower portion of the reaction tube 203. A vacuum pump 246 serving as a vacuum exhaust structure is connected to the exhaust pipe 231 through a pressure sensor 245 and an APC (Automatic Pressure Controller) valve 243. The pressure sensor 245 serves as a pressure detector (pressure meter) to detect an inner pressure of the process chamber 201, and the APC valve 243 serves as a pressure regulator (pressure adjusting structure). The vacuum pump 246 is configured to be capable of vacuum-exhausting the inner atmosphere of the process chamber 201 such that the inner pressure of the process chamber 201 reaches and is maintained at a predetermined pressure (vacuum degree).

The exhaust pipe 232 at a downstream side of the vacuum pump 246 is connected to a component such as a waste gas processing apparatus (not shown). Further, the APC valve 243 is configured to be capable of controlling a start of a vacuum-exhaust of the process chamber 201 and a stop of the vacuum-exhaust of the process chamber 201 by opening and closing a valve body of the APC valve 243. In addition, the APC valve 243 is configured to be capable of adjusting the inner pressure of the process chamber 201 by adjusting an opening degree or a conductance of the valve body of the APC valve 243.

The plurality of gas supply holes 411 of the nozzle 410 and the exhaust port 230 are arranged to face each other with the wafers 200 interposed therebetween. Thereby, the process gas supplied through the plurality of gas supply holes 411 can be supplied (or flow) across the surfaces of the wafers 200 in a direction toward the exhaust pipe 231. Thus, it is possible to more uniformly supply the process gas to the entirety of the surfaces (upper surfaces) of the wafers 200. As a result, it is possible to form the film more uniformly on the surfaces of the wafers 200.

According to the present embodiments, an exhauster (which is an exhaust structure or an exhaust system) is constituted mainly by the exhaust pipe 231, the APC valve 243, the vacuum pump 246 and the pressure sensor 245.

<Temperature Sensor>

A temperature sensor 263 (see FIGS. 4 and 6) serving as a temperature detector is provided in the reaction tube 203. The controller 280 described later is electrically connected to the temperature sensor 263. The controller 280 is configured to be capable of adjusting the power supplied to the heater 207 based on temperature information detected by the temperature sensor 263 such that a desired temperature distribution of an inner temperature of the process chamber 201 can be obtained. The temperature sensor 263 is of an "L" shape, and is provided along the inner wall of the reaction tube 203.

<Controller>

Figure 6:
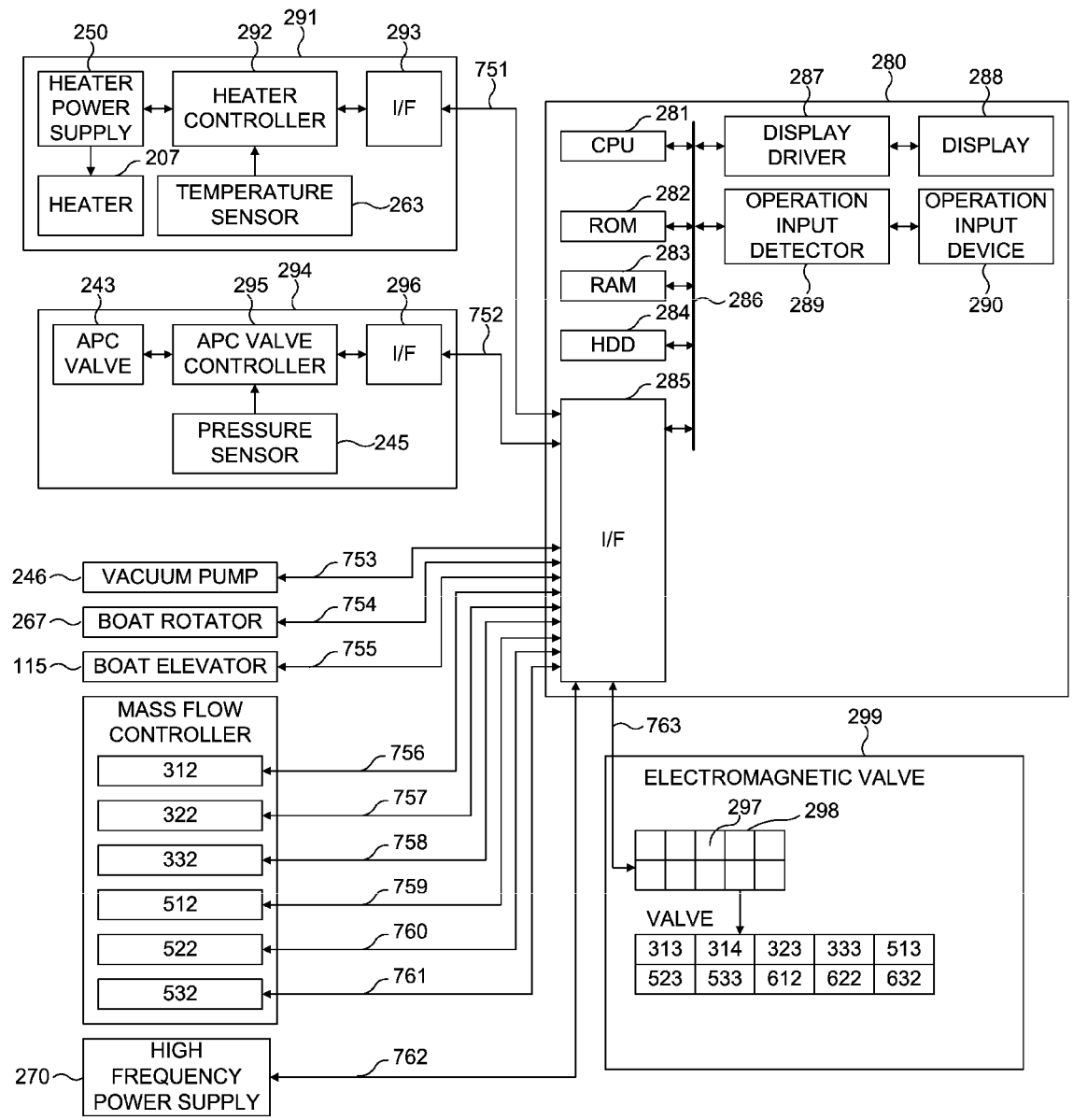
FIG. 6 is a block diagram schematically illustrating a controller and components controlled by the controller of the substrate processing apparatus shown in FIG. 1.

As shown in FIG. 6, the controller 280 may be constituted by an industrial computer including: a CPU (Central Processing Unit) 281 configured to control an overall operation of the substrate processing apparatus 101; a ROM (Read-Only Memory) 282 and an HDD (Hard Disk Drive) 284 configured to store various programs including a control program and various data in advance; a RAM (Random Access Memory) 283 configured to temporarily store various data; and a system bus 286 through which the CPU 281, the ROM 282, the HDD 284 and the RAM 283 are connected. The controller 280 may further include: a communication interface ("I/F" in FIG. 6) 285; a display driver 287 configured to control the display of various information on a display 288 and to receive operation information from the display 288; and an operation input detector 289 configured to detect an operation state of an operation input device 290.

The controller 280 may further include: the display 288 configured to display various information such as an operation menu; and the operation input device 290 including a plurality of keys and configured to input various information and various operation instructions. The ROM 282 and the HDD 284 serve as a computer-readable recording medium, and the controller 280 reads the programs and the data recorded in the ROM 282 and the HDD 284 to perform a predetermined function. Further, a new program and data recorded on an external recording medium (not shown) may be loaded (or recorded) onto the ROM 282 or the HDD 284.

A temperature controller 291, a pressure controller 294, the vacuum pump 246, the boat rotator 267, the boat elevator 115, the liquid mass flow controller 312, the mass flow controllers 322, 332, 512, 522, and 532 and a valve controller 299 are connected to one another via the communication interface 285, and are configured to be capable of transmitting and receiving various information via the communication interface 285.

The CPU 281, the ROM 282, the RAM 283, the HDD 284, the display driver 287, the operation input detector 289 and the communication interface 285 are connected to one another via the system bus 286. Therefore, the CPU 281 can access the ROM 282, the RAM 283 and the HDD 284. Further, the CPU 281 can control the display of the various information on the display 288 via the display driver 287 and can receive the operation information from the display 288 via the display driver 287. In addition, the CPU 281 can control a transmission or reception of the various information to or from the components described above via the communication interface 285. Further, the CPU 281 can recognize the operation state of a user with respect to the operation input device 290 via the operation input detector 289.

The temperature controller 291 may include: the heater 207; a heater power supply 250 configured to supply an electric power to the heater 207; the temperature sensor 263; a communication interface ("I/F" in FIG. 6) 293 configured to exchange (that is, transmit or receive) various information such as pre-set temperature information with the controller 280; and a heater controller 292 configured to control the electric power supplied from the heater power supply 250 to the heater 207 based on information such as the pre-set temperature information received through the communication interface 293 and the temperature information from the temperature sensor 263. The heater controller 292 may be implemented with a computer. The communication interface 293 of the temperature controller 291 and the communication interface 285 of the controller 280 are connected by a cable 751.

The pressure controller 294 may include: a communication interface ("I/F" in FIG. 6) 296 and an APC valve controller 295. The communication interface 296 is configured to exchange (that is, transmit or receive) various information such as a pre-set pressure information and opening/closing information of the APC valve 243 with the APC valve 243, the pressure sensor 245 and the controller 280. The APC valve controller 295 is configured to control the opening degree of the valve body of the APC valve 243 and an opening and closing operation of the APC valve 243 based on information such as the pre-set pressure information received through the communication interface 296, the opening/closing information of the APC valve 243 and pressure information from the pressure sensor 245. The APC valve controller 295 may be implemented with a computer. The communication interface 296 of the pressure controller 294 and the communication interface 285 of the controller 280 are connected by a cable 752.

The vacuum pump 246, the boat rotator 267, the boat elevator 115, the liquid mass flow controller 312, the mass flow controllers 322, 332, 512, 522 and 532 and the high frequency power supply 270 are connected to the communication interface 285 of the controller 280 by cables 753, 754, 755, 756, 757, 758, 759, 760, 761 and 762, respectively.

The valve controller 299 may include: the valves 313, 314, 323, 333, 513, 523, 533, 612, 622 and 632 serving as air valves; and an electromagnetic valve group 298 configured to control a supply of air to the valves 313, 314, 323, 333, 513, 523, 533, 612, 622 and 632. The electromagnetic valve group 298 may include electromagnetic valves 297 corresponding to the valves 313, 314, 323, 333, 513, 523, 533, 612, 622 and 632, respectively. The electromagnetic valve group 298 and the communication interface 285 of the controller 280 are connected by a cable 763.

As described above, the components such as the liquid mass flow controller 312, the mass flow controllers 322, 332, 512, 522 and 532, the valves 313, 314, 323, 333, 513, 523, 533, 612, 622 and 632, the APC valve 243, the heater power supply 250, the temperature sensor 263, the pressure sensor 245, the vacuum pump 246, the boat rotator 267, the boat elevator 115 and the high frequency power supply 270 are connected to the controller 280.

The controller 280 may be configured to control various operations such as a flow rate adjusting operation of the liquid mass flow controller 312, flow rate adjusting operations of the mass flow controllers 322, 332, 512, 522 and 532, opening and closing operations of the valves 313, 314, 323, 333, 513, 523, 533, 612, 622 and 632, an opening and closing operation of the APC valve 243. The controller 280 may be configured to further control various operations such as a pressure adjusting operation via an adjusting operation of the opening degree of the APC valve 243 based on the pressure information from the pressure sensor 245, a temperature adjusting operation of the heater 207 via an adjusting operation of a power supply amount from the heater power supply 250 to the heater 207 based on the temperature information from the temperature sensor 263, and a control operation of the high frequency power supplied from the high frequency power supply 270. The controller 280 may be configured to further control various operations such as a start and stop control operation of the vacuum pump 246, an adjusting operation of a rotation speed of the boat rotator 267, and an elevating and lowering operation of the boat elevator 115.

The controller 280 controls the DC bias applied to the boat 217 from the DC power supply 269 via the boat rotator 267.

<Method of Manufacturing Semiconductor Device>

Subsequently, an example of the substrate processing, which is a part of a manufacturing process of a semiconductor device such as an LSI (Large Scale Integration) circuit, will be described. The substrate processing is performed by using the substrate processing apparatus 101 described above. In the following description, operations of the components constituting the substrate processing apparatus 101 are controlled by the controller 280.

The LSI circuit is manufactured through an assembly process, a test process and a reliability test process after a wafer process is performed on a silicon wafer (that is, the wafer 200). The wafer process is divided into the substrate processing in which the silicon wafer is processed by a processing (such as an oxidation process and a diffusion process), and a wiring process in which wirings are formed on a surface of the silicon wafer. In the wiring process, processes such as a cleaning process, the heat treatment process and a film-forming process are repeatedly performed in addition to a photolithography process as a key process. In the photolithography process, by forming a photoresist pattern and performing an etching process by using the photoresist pattern as a mask, it is possible to process a layer below the photoresist pattern.

Hereinafter, an example of forming a silicon oxide film at a low temperature of 200° C. or lower by using the substrate processing apparatus 101 will be described.

According to a CVD (Chemical Vapor Deposition) method, for example, a plurality of types of gases containing a plurality of elements constituting the film to be formed are simultaneously supplied onto the silicon wafer. Further, according to a cyclic deposition method, for example, a plurality of types of gases containing a plurality of elements constituting the film to be formed are alternately supplied onto the silicon wafer. Then, a silicon oxide film (also referred to as an "SiO film") or a silicon nitride film (also referred to as an "SiN film") can be formed by controlling process conditions such as a supply flow rate and a supply time (time duration) of each gas and the power of the plasma. According to the CVD method or the cyclic deposition method, for example, when forming the SiO film, the process conditions are controlled such that a composition ratio of the film is substantially equal to a stoichiometric composition (that is, a ratio of oxygen (O) to silicon (Si) is substantially equal to 2). Further, according to the CVD method or the cyclic deposition method, for example, when forming the SiN film, the process conditions are controlled such that the composition ratio of the film is substantially equal to the stoichiometric composition (that is, a ratio of nitrogen (N) to silicon (Si) is substantially equal to 1.33).

On the other hand, the process conditions may be controlled such that the composition ratio of the film to be formed may be a predetermined composition ratio different from the stoichiometric composition. That is, for example, the process conditions may be controlled such that at least one element of the plurality of elements constituting the film to be formed may be in excess of the other elements by the standard of the stoichiometric composition. As described above, it is possible to form the film while controlling a ratio of the plurality of elements constituting the film to be formed (that is, while controlling the composition ratio of the film). Hereinafter, an exemplary sequence of forming the silicon oxide film whose composition ratio is equal to the stoichiometric composition thereof by alternately supplying a plurality of types of gases containing a plurality of elements will be described.

In the exemplary sequence of forming the silicon oxide film, silicon (Si) is used as a first element, and oxygen (O) is used as a second element. A gas containing silicon serving as the first element may also be referred to as a "silicon source gas", and a gas (which is a reactive gas) containing oxygen serving as the second element may also be referred to as an "oxygen-containing gas". The exemplary sequence of forming the silicon oxide film serving as an insulating film on the substrate (that is, the wafer 200) will be described with reference to FIG. 7.

First, the heater power supply 250 configured to supply the electric power to the heater 207 is controlled to maintain the inner temperature of the process chamber 201 at a predetermined temperature of 200° C. or lower, more preferably, 100° C. or lower. For example, the predetermined temperature may be set to 100° C.

Then, in a wafer charging step S201, the wafers 200 with the photoresist pattern formed thereon are transferred (or charged) into the boat 217.

Thereafter, the vacuum pump 246 is operated. In addition, the furnace opening shutter 147 (see FIG. 1) is opened. The boat 217 supporting the wafers 200 is transferred (or loaded) into the process chamber 201 by being elevated by the boat elevator 115 (boat loading step S202). With the boat 217 loaded in the process chamber 201, the lower end opening of the reaction tube 203 is airtightly sealed by the seal cap 219 via the O-ring 220. Thereafter, the boat 217 is rotated by the boat rotator 267 to rotate the wafers 200 supported by the boat 217.

Thereafter, the APC valve 243 is opened and the vacuum pump 246 vacuum-exhausts the inner atmosphere of the process chamber 201 such that the inner pressure of the process chamber 201 reaches and is maintained at a desired pressure (vacuum degree). After a temperature of the wafer 200 is stabilized, for example, when the temperature of the wafer 200 reaches and is maintained at 100° C. (pressure and temperature adjusting step S203), the following steps are sequentially performed while maintaining the inner temperature of the process chamber 201 at 100° C.

Further, the inner pressure of the process chamber 201 is measured by the pressure sensor 245, and the opening degree of the APC valve 243 is feedback-controlled based on the pressure information measured by the pressure sensor 245 (pressure adjusting step). In addition, the heater 207 heats the process chamber 201 such that the inner temperature of the process chamber 201 reaches and is maintained at a desired temperature. A state of the electric power supplied from the heater power supply 250 to the heater 207 is feedback-controlled based on the temperature information detected by the temperature sensor 263 such that the inner temperature of the process chamber 201 reaches and is maintained at the desired temperature (temperature adjusting step).

Subsequently, a silicon oxide film forming step of forming the silicon oxide film by supplying the silicon source gas and the oxygen-containing gas into the process chamber 201 is performed. In the silicon oxide film forming step, the following four steps, that is, a silicon source gas supply step S204, a residual gas removing step S205, an activated oxygen-containing gas supply step S206 and a residual gas removing step S207 are sequentially and repeatedly performed.

<Silicon Source Gas Supply Step S204>

In the silicon source gas supply step S204, the silicon source gas is supplied into the process chamber 201 through the gas supply pipe 310 and the nozzle 410 of the process gas supplier 301.

First, the valve 313 is closed and the valves 314 and 612 are opened before supplying the silicon source gas to the process chamber 201. When the silicon source gas is in a liquid state at a normal temperature, the silicon source gas in the liquid state is supplied to the vaporizer 315 after a flow rate of the silicon source gas in the liquid state is adjusted by the liquid mass flow controller 312, and then is vaporized by the vaporizer 315. After vaporized by the vaporizer 315, the silicon source gas is introduced (supplied) to the vent line 610 through the valve 612.

Subsequently, when the silicon source gas is supplied to the process chamber 201, with the valve 612 closed and the valve 313 open, the silicon source gas is supplied to the gas supply pipe 310 at the downstream side of the valve 313. In addition, with the valve 513 open, the carrier gas such as N2 gas is supplied through the carrier gas supply pipe 510. The flow rate of the carrier gas (N2 gas) is adjusted by the mass flow controller 512. The silicon source gas joins and is mixed with the carrier gas (N2 gas) in the gas supply pipe 310 at the downstream side of the valve 313. Then, the silicon source gas together with the carrier gas is supplied to the process chamber 201 through the plurality of gas supply holes 411 of the nozzle 410, and is exhausted through the exhaust pipe 231.

In the silicon source gas supply step S204, the APC valve 243 is appropriately adjusted (or controlled) such that the inner pressure of the process chamber 201 can be set to a predetermined pressure within a range from 50 Pa to 900 Pa. For example, the predetermined pressure in the silicon source gas supply step S204 may be set to and maintained at 300 Pa. For example, a supply flow rate of the silicon source gas adjusted by the liquid mass flow controller 312 may be set to a predetermined flow rate within a range from 0.05 g/min to 3.00 g/min. For example, the predetermined flow rate in the silicon source gas supply step S204 may be set to 1.00 g/min. In the present specification, a notation of a numerical range such as "from 50 Pa to 900 Pa" means that a lower limit and an upper limit are included in the numerical range. Therefore, for example, the numerical range "from 50 Pa to 900 Pa" means a range equal to or higher than 50 Pa and equal to or lower than 900 Pa. The same also applies to other numerical ranges described herein.

For example, a time duration of exposing (or supplying) the silicon source gas to the wafer 200 may be set to a predetermined time within a range from 2 seconds to 6 seconds. For example, the predetermined time in the silicon source gas supply step S204 may be set to 3 seconds. For example, by controlling the heater power supply 250 of supplying the electric power to the heater 207, the heater 207 heats the process chamber 201 such that the inner temperature of the process chamber 201 reaches and is maintained to a predetermined temperature of 200° C. or less, and preferably 100° C. or less. For example, the predetermined temperature in the silicon source gas supply step S204 may be set to 100° C.

In the silicon source gas supply step S204, the silicon source gas and the N2 gas serving as the carrier gas (inert gas) are supplied into the process chamber 201 without any other gas being supplied into the process chamber 201 together with the silicon source gas and the N2 gas. In addition, there is no O2 gas in the process chamber 201. Therefore, without causing a gas phase reaction, the silicon source gas reacts with the surface of the wafer 200 or a base film of the wafer 200 by a surface reaction (chemisorption). As a result, an adsorption layer (chemisorption layer) of a source material (silicon source gas) or a silicon layer is formed. Hereinafter, the adsorption layer of the silicon source gas and the silicon layer may also be collectively or individually referred to as a "silicon-containing layer". The chemisorption layer of the silicon source gas may refer to not only a continuous adsorption layer of molecules of the silicon source gas but also a discontinuous chemisorption layer of the molecules of the silicon source gas. The silicon layer may refer to not only a continuous layer constituted by silicon but also a silicon film formed by stacking the continuous layer constituted by silicon. The continuous layer constituted by silicon may also be referred to as the "silicon film".

In the silicon source gas supply step S204, when the N2 gas (inert gas) is supplied through the carrier gas supply pipe 520 to the middle of the gas supply pipe 320 by opening the valve 523, it is possible to prevent the silicon source gas from entering the nozzle 420, the buffer chamber 423 and the gas supply pipe 320 (through which the oxygen-containing gas is supplied). Similarly, when the N2 gas (inert gas) is supplied through the carrier gas supply pipe 530 to the middle of the gas supply pipe 330 by opening the valve 533, it is possible to prevent the silicon source gas from entering the nozzle 430, the buffer chamber 433 and the gas supply pipe 330 (through which the oxygen-containing gas is supplied). Further, the flow rate of the N2 gas (inert gas) controlled by each of the mass flow controllers 522 and 532 may be small since the N2 gas (inert gas) is supplied to prevent the silicon source gas from entering the components through which the oxygen-containing gas is supplied.

<Residual Gas Removing Step S205>

In the residual gas removing step S205, a residual gas in the process chamber 201 such as a residual silicon source gas is removed from the process chamber 201. The valve 313 of the gas supply pipe 310 is closed to stop a supply of the silicon source gas to the process chamber 201, and the valve 612 is opened to supply the silicon source gas to the vent line 610. In the residual gas removing step S205, with the APC valve 243 of the exhaust pipe 231 fully open, the vacuum pump 246 vacuum-exhausts the inner atmosphere of the process chamber 201 such that the inner pressure of the process chamber 201 reaches 20 Pa or less. As a result, the residual gas in the process chamber 201 such as the residual silicon source gas is removed from the process chamber 201. In the residual gas removing step S205, in order to improve an efficiency of removing the residual gas in the process chamber 201 such as the residual silicon source gas, the inert gas such as the N2 gas may be supplied into the process chamber 201 through the gas supply pipe 310 serving as a silicon source gas supply line and further through the gas supply pipes 320 and 330.

<Activated Oxygen-Containing Gas Supply Step S206>

In the activated oxygen-containing gas supply step S206, the oxygen-containing gas is supplied through the gas supply pipe 320 of the gas supplier 302 into the buffer chamber 423 via the plurality of gas supply holes 421 of the nozzle 420. When the oxygen-containing gas is supplied, the high frequency power is applied between the rod-shaped electrode 471 and the rod-shaped electrode 472 from the high frequency power supply 270 through the matcher 271. Thereby, the oxygen-containing gas supplied into the buffer chamber 423 is excited by the plasma, is supplied into the process chamber 201 as the active species through the plurality of gas supply holes 425, and then is exhausted through the exhaust pipe 231. In the activated oxygen-containing gas supply step S206, a flow rate of the oxygen-containing gas supplied into the buffer chamber 423 is adjusted by the mass flow controller 322.

Further, in the activated oxygen-containing gas supply step S206, the oxygen-containing gas is supplied through the gas supply pipe 330 of the gas supplier 303 into the buffer chamber 433 via the plurality of gas supply holes 431 of the nozzle 430. When the oxygen-containing gas is supplied, the high frequency power is applied between the rod-shaped electrode 481 and the rod-shaped electrode 482 from the high frequency power supply 270 through the matcher 271. Thereby, the oxygen-containing gas supplied into the buffer chamber 433 is excited by the plasma, is supplied into the process chamber 201 as the active species through the plurality of gas supply holes 435, and then is exhausted through the exhaust pipe 231. In the activated oxygen-containing gas supply step S206, the flow rate of the oxygen-containing gas supplied into the buffer chamber 433 is adjusted by the mass flow controller 332.

In the activated oxygen-containing gas supply step S206, the valve 323 is closed and the valve 622 is opened before supplying the oxygen-containing gas into the buffer chamber 423, and the oxygen-containing gas is supplied to the vent line 620 via the valve 622. Similarly, the valve 333 is closed and the valve 632 is opened before supplying the oxygen-containing gas into the buffer chamber 433, and the oxygen-containing gas is supplied to the vent line 630 via the valve 632.

When the oxygen-containing gas is supplied to the buffer chamber 423, with the valve 622 closed and the valve 323 open, the oxygen-containing gas is supplied to the gas supply pipe 320 at the downstream side of the valve 323. In addition, with the valve 523 open, the carrier gas such as the N2 gas is supplied to the gas supply pipe 320 through the carrier gas supply pipe 520. The flow rate of the carrier gas (N2 gas) is adjusted by the mass flow controller 522. The oxygen-containing gas joins and is mixed with the carrier gas (N2 gas) in the gas supply pipe 320 at the downstream side of the valve 323. Then, the oxygen-containing gas together with the carrier gas is supplied to the buffer chamber 423 through the nozzle 420.

When the oxygen-containing gas is supplied to the buffer chamber 433, with the valve 632 closed and the valve 333 open, the oxygen-containing gas is supplied to the gas supply pipe 330 at the downstream side of the valve 333. In addition, with the valve 533 open, the carrier gas such as the N2 gas is supplied to the gas supply pipe 330 through the carrier gas supply pipe 530. The flow rate of the carrier gas (N2 gas) is adjusted by the mass flow controller 532. The oxygen-containing gas joins and is mixed with the carrier gas (N2 gas) in the gas supply pipe 330 at the downstream side of the valve 333. Then, the oxygen-containing gas together with the carrier gas is supplied to the buffer chamber 433 through the nozzle 430.

When the oxygen-containing gas is supplied as the active species by plasma-exciting the oxygen-containing gas, the APC valve 243 is appropriately adjusted (or controlled) such that the inner pressure of the process chamber 201 can be set to a predetermined pressure within a range from 50 Pa to 900 Pa. For example, the predetermined pressure in the activated oxygen-containing gas supply step S206 may be set to 500 Pa. For example, a supply flow rate of the oxygen-containing gas adjusted by the mass flow controller 322 may be set to a predetermined flow rate within a range from 2,000 sccm to 9,000 sccm. For example, the predetermined flow rate of the oxygen-containing gas adjusted by the mass flow controller 322 may be set to 6,000 sccm. Similarly, the supply flow rate of the oxygen-containing gas adjusted by the mass flow controller 332 may be set to a predetermined flow rate within a range from 2,000 sccm to 9,000 sccm. For example, the predetermined flow rate of the oxygen-containing gas adjusted by the mass flow controller 332 may be set to 6,000 sccm. For example, a time duration (that is, a gas supply time) of exposing (or supplying) the active species obtained by plasma-exciting the oxygen-containing gas to the wafer 200 may be set to a predetermined time within a range from 3 seconds to 20 seconds. For example, the predetermined time in the activated oxygen-containing gas supply step S206 may be set to 9 seconds.

For example, the high frequency power applied from the high frequency power supply 270 to between the rod-shaped electrode 471 and the rod-shaped electrode 472 may be set to a predetermined power within a range from 20 W to 600 W. For example, the high frequency power applied from the high frequency power supply 270 to between the rod-shaped electrode 471 and the rod-shaped electrode 472 may be set to 200 W. Similarly, the high frequency power applied from the high frequency power supply 270 to between the rod-shaped electrode 481 and the rod-shaped electrode 482 may be set to a predetermined power within a range from 20 W to 600 W. For example, the high frequency power applied from the high frequency power supply 270 to between the rod-shaped electrode 481 and the rod-shaped electrode 482 may be set to 200 W. The high frequency power can be supplied continuously or intermittently during the gas supply time. By intermittently exciting the oxygen-containing gas on the order of several microseconds, it is possible to lower an electron temperature and it is also possible to promote a generation of a negative ion. For example, by controlling the heater power supply 250 of supplying the electric power to the heater 207, the heater 207 heats the process chamber 201 such that the inner temperature of the process chamber 201 reaches and is maintained to a predetermined temperature of 200° C. or less, and preferably 100° C. or less. For example, the predetermined temperature in the activated oxygen-containing gas supply step S206 may be set to 100° C.

Herein, since a reaction temperature of the oxygen-containing gas itself is high, it is difficult to react the oxygen-containing gas with the silicon-containing layer at the inner temperature of the process chamber 201 and the inner pressure of the process chamber 201 described above. Therefore, the active species obtained by plasma-exciting the oxygen-containing gas is supplied into the process chamber 201. As a result, it is possible to set the inner temperature of the process chamber 201 to a low temperature such as the predetermined temperature of 200° C. or less. However, since it takes time to change the inner temperature of the process chamber 201, it is preferable that the inner temperature of the process chamber 201 is set to be the same as that of the process chamber 201 when the silicon source gas is supplied.

The active species generated in each of the buffer chambers 423 and 433 is supplied to each of the plurality of process spaces 215 inside the boat 217 through the plurality of gas supply holes 425 and the plurality of gas supply holes 435 along with a gas flow. In the activated oxygen-containing gas supply step S206, a mixed gas of the oxygen-containing gas and the N2 gas serving as the carrier gas flows (or is supplied) into the process chamber 201 without any other gas being supplied into the process chamber 201 together with the oxygen-containing gas and the N2 gas. In addition, the mixed gas contains the active species such as an O2 molecule, an oxygen atom and an O+ ion (which are in an excited state or in a metastable state). In the activated oxygen-containing gas supply step S206, the silicon source gas is not supplied into the process chamber 201. Therefore, without causing a gas phase reaction, the active species of the oxygen-containing gas or the oxygen-containing gas activated by the plasma reacts with the silicon-containing layer serving as a first layer on the surface of the wafer 200 formed in the silicon source gas supply step S204. Thereby, the silicon-containing layer is oxidized and modified into a silicon oxide layer (also referred to as an "SiN layer") containing silicon as the first element and oxygen as the second element, that is, a second layer.

In the activated oxygen-containing gas supply step S206, when the N2 gas (inert gas) is supplied through the carrier gas supply pipe 510 to the middle of the gas supply pipe 310 by opening the valve 513, it is possible to prevent the oxygen-containing gas from entering the nozzle 410 and the gas supply pipe 310 (through which the silicon source gas is supplied). Further, the flow rate of the N2 gas (inert gas) controlled by the mass flow controller 512 may be small since the N2 gas (inert gas) is supplied to prevent the oxygen-containing gas from entering the components through which the silicon source gas is supplied.

By the way, in each of the plurality of process spaces 215 in the boat 217, a sheath (which is an ion sheath) is formed on the surfaces of the wafers 200 due to a potential difference between a plasma space and the wafers 200. For example, due to the sheath, it may be difficult for the active species (the plasma active species) to flow toward the wafer 200 or it may be difficult for the active species (the plasma active species) to dissociate. Thereby, a uniformity of the film deposited on the surface of the wafer 200 may deteriorate. In addition, in a case where the plurality of process spaces 215 are located too far from the plasma space and thereby a density of charged particles is low and a uniform incidence of the active species due to a self-bias cannot be expected or in a case where the active species is being deactivated, the uniformity of the film deposited on the surface of the wafer 200 may deteriorate.

As a countermeasure, according to the present embodiments, the DC bias is applied to each of the wafers 200 from the DC power supply 269 via the boat rotator 267 and the boat 217 so as control the sheath formed on the surface of each of the wafers 200 or the electric field surrounding the sheath. Even when a back surface of each of the wafers 200 serves as an insulator, it is possible to form a rotationally symmetrical bias electric field around the wafers 200 by the plurality of electrode plates 214. Thereby, it is possible to apply the bias to each of the wafers 200. Specifically, the boat 217 is conductive, and is electrically connected to the wafers 200. The boat 217 is electrically connected to the DC power supply 269 via the metal structure 222 of the boat support base 218, the internal conductor 266 of the boat rotator 267 and the slip ring 268.

The controller 280 controls the DC power supply 269 in the activated oxygen-containing gas supply step S206 to apply a negative DC bias from the DC power supply 269 to each of the wafers 200 through the boat rotator 267 and the boat 217. Thereby, an electric field capable of promoting an incidence of a positive ion onto the wafers 200 is formed between the sheath formed on the surfaces of the wafers 200 and the wafers 200 or between the buffer chambers 423 and 433 and the wafers 200. Further, it is possible to shorten a time for the active species to reach the wafers 200, or it is possible to increase the incident energy of the active species. Conversely, when a positive DC bias is applied to each of the wafers 200, an electric field capable of promoting an incidence of a negative ion onto the wafers 200 is formed. Further, it is possible to shrink the sheath. Further, each of the wafers 200 is brought closer to or in contact with a higher density plasma. Thereby, not only the ion but also an electrically neutral plasma active species may be more likely to interact with the surfaces of the wafers 200. As a result, it is possible to promote the reaction between the plasma active species and the silicon-containing layer on the surfaces of wafers 200. When the DC power supply 269 is controlled, a polarity and the voltage of the DC bias can be selected so as to suppress a deterioration of a uniformity of the silicon oxide layer deposited on the surface of the wafer 200.

<Residual Gas Removing Step S207>

In the residual gas removing step S207, a residual gas in the process chamber 201 such as a residual oxygen-containing gas which did not react or which contributed to an oxidization of the first layer is removed from the process chamber 201. Specifically, the valve 323 of the gas supply pipe 320 is closed to stop a supply of the oxygen-containing gas to the process chamber 201, and the valve 622 is opened to supply the oxygen-containing gas to the vent line 620. Similarly, the valve 333 of the gas supply pipe 330 is closed to stop the supply of the oxygen-containing gas to the process chamber 201, and the valve 632 is opened to supply the oxygen-containing gas to the vent line 630.

In the residual gas removing step S207, with the APC valve 243 of the exhaust pipe 231 fully open, the vacuum pump 246 vacuum-exhausts the inner atmosphere of the process chamber 201 such that the inner pressure of the process chamber 201 reaches 20 Pa or less. As a result, the residual gas in the process chamber 201 such as the residual oxygen-containing gas is removed from the process chamber 201. In the residual gas removing step S207, in order to further improve an efficiency of removing the residual gas in the process chamber 201 such as the residual oxygen-containing gas, the inert gas such as the N2 gas may be supplied into the process chamber 201 through the gas supply pipes 320 and 330 serving as an oxygen-containing gas supply line and further through the gas supply pipe 310.

By performing a cycle including the silicon source gas supply step S204 through the residual gas removing step S207 at least once (step S208), the silicon oxide film of a predetermined thickness is formed on the wafer 200. When forming the silicon oxide film, the inner temperature and the inner pressure of the process chamber 201 can be selected not only such that a thickness of the adsorption layer is self-limiting to about one molecule, but also such that the thickness of the adsorption layer is determined in accordance with a supply rate or a reaction rate of the plasma.

Thereafter, the inner atmosphere of the process chamber 201 is purged with the inert gas by supplying the inert gas such as the N2 gas into the process chamber 201 and exhausting the inert gas such as the N2 gas from the process chamber 201 (gas purge step S210). The gas purge step S210 may be preferably performed by repeatedly performing a cycle including: supplying the inert gas such as the N2 gas into the process chamber 201 with the APC valve 243 closed and the valves 513, 523 and 533 open after the residual gas is removed from the process chamber 201; and vacuum-exhausting the inner atmosphere of the process chamber 201 with the APC valve 243 open after stopping the supply of the inert gas such as the N2 gas into the process chamber 201 by closing the valves 513, 523 and 533.

Thereafter, the rotation of the boat 217 by the boat rotator 267 is stopped. Thereafter, by opening the valves 513, 523 and 533, the inner atmosphere of the process chamber 201 is replaced with the inert gas such as the N2 gas (substitution by the inert gas), and the inner pressure of the process chamber 201 is returned to an atmospheric pressure (returning to atmospheric pressure step S212). Thereafter, the seal cap 219 is lowered by the boat elevator 115 and the lower end opening of the reaction tube 203 is opened. The boat 217 with the plurality of processed wafers including the wafer 200 charged therein is unloaded out of the process chamber 201 through the lower end opening of the reaction tube 203 (boat unloading step S214). After the boat 217 is unloaded, the lower end opening of the reaction tube 203 is closed by the furnace opening shutter 147. Then, the vacuum pump 246 is stopped. Thereafter, the plurality of processed wafers including the wafer 200 are discharged from the boat 217 (wafer discharging step S216). Thereby, a single batch process of the substrate processing of forming the film is completed.

<Effects According to Present Embodiments>

Subsequently, effects according to the present embodiments will be described.

As described above, according to the present embodiments, in the activated oxygen-containing gas supply step S206, the controller 280 controls the DC power supply 269 to apply the DC bias from the DC power supply 269 to each of the wafers 200 through the boat rotator 267 and the boat 217. Thereby, it is possible to shrink the sheath formed on the surfaces of the wafers 200. Further, the plasma active species can be easily drawn into the surfaces of the wafers 200 and can easily dissociate. As a result, it is possible to promote the reaction between the plasma active species and the silicon-containing layer on the surfaces of wafers 200. Thereby, it is possible to suppress the deterioration of the uniformity of the silicon oxide layer deposited on the surface of the wafer 200.

Further, the DC power supply 269 is electrically connected to the internal conductor 266 of the boat rotator 267 by a DC coupling via the slip ring 268. As a result, the DC power is stably supplied from the DC power supply 269 to the internal conductor 266 (which is being rotated) by using the slip ring 268.

Further, the internal conductor 266 is electrically connected to the boat 217 through the metal structure 222 of the boat support base 218. More specifically, the boat support base 218 includes the insulating structure 221 and the metal structure 222. The lower surface of the bottom plate 210 of the boat 217 is placed on and fixed to the upper surface 221U of the insulating structure 221. The contact portion 223 of the metal structure 222 is provided inside the insulating structure 221. The contact surface 223U of the contact portion 223 is exposed from the upper surface 221U of the insulating structure 221, and is in contact with the lower surface of the bottom plate 210 of the boat 217.

According to the present embodiments, the entirety of the contact surface 223U of the contact portion 223 is covered with the lower surface of the bottom plate 210 of the boat 217. Thereby, it is possible to protect the contact surface 223U of the contact portion 223 from the substance such as the process gas and the plasma by using the lower surface of the bottom plate 210.

Further, the internal conductor 266 is provided inside the insulator tube 266a. Thereby, it is possible to protect the internal conductor 266 from the substance such as the process gas and the plasma by using the insulator tube 266a.

<Modified Examples According to Present Embodiments>

Subsequently, modified examples of the present embodiments will be described.

For example, the embodiments described above are described by way of an example in which the positive DC bias is applied from the DC power supply 269 to each of the wafers 200 in the activated oxygen-containing gas supply step S206. However, a magnitude of the DC bias applied from the DC power supply 269 to each of the wafers 200 may be appropriately changed according to conditions such as the sheath (sheath voltage) formed on the surfaces of the wafers 200 and a state of the film formed on the surfaces of the wafers 200. Therefore, for example, it is possible to apply the negative DC bias from the DC power supply 269 to each of the wafers 200. Further, the embodiments described above are not limited to the DC power supply 269. For example, an AC (alternating current) power supply whose frequency is lower than an excitation frequency of the high frequency power supply 270 and a plasma oscillation frequency may be used.

For example, the embodiments described above are described by way of an example in which the boat 217 supports the wafers 200 by using the plurality of support grooves 213 of the plurality of support columns 212. However, the wafers 200 may be supported by a plurality of pins protruding from the plurality of support columns 212 or from the plurality of electrode plates 214. Further, the plurality of electrode plates 214 are not limited to applying the bias by physically contacting the wafers 200. For example, the bias may be applied indirectly by an electric field generated around the plurality of electrode plates 214. Further, the plurality of electrode plates 214 are not limited to a ring shape. For example, each of the plurality of electrode plates 214 may be of an arbitrary shape such as a disk shape. By forming each of the plurality of electrode plates 214 in a shape of a disk whose diameter is smaller than that of the wafer 200 and facing only the vicinity of the center of the wafer 200, it is possible to promote the processing for the film on the wafer 200 by the plasma in a desired region corresponding to the disk, and it is also possible to improve the uniformity on the surface of the wafer 200. In such a case, it is assumed that each of the plurality of support columns 212 and each of the plurality of electrode plates 214 are connected by a component such as a conductive rod.

For example, the embodiments described above are described by way of an example in which the first remote plasma generating structure 429 and the second remote plasma generating structure 439 are provided inside the reaction tube 203. However, the first remote plasma generating structure 429 and the second remote plasma generating structure 439 may be provided outside the reaction tube 203.

For example, the embodiments described above are described by way of an example in which the soft plasma method is used. According to the soft plasma method, each of the first remote plasma generating structure 429 and the second remote plasma generating structure 439 is configured such that one of the rod-shaped electrodes is grounded. However, a plasma method using a balanced feeding in which both of the rod-shaped electrodes are not grounded may also be used.

For example, the embodiments described above are described by way of an example in which the two remote plasma generating structures (that is, the first remote plasma generating structure 429 and the second remote plasma generating structure 439) are provided in the reaction tube 203. However, at least one remote plasma generating structure may be provided in the reaction tube 203.

For example, the embodiments described above are described by way of an example in which the first remote plasma generating structure 429 and the second remote plasma generating structure 439 are used to form the silicon oxide film on the surface of the wafer 200 by using the oxygen-containing gas. However, the first remote plasma generating structure 429 and the second remote plasma generating structure 439 may be used to form the silicon nitride film on the surface of the wafer 200 by using a nitrogen-containing gas.

For example, in the embodiments described above, a silane-based gas such as monosilane (SiH4) gas, disilane (Si2H6) gas and trisilane (Si3H8) gas or a chlorosilane-based gas such as monochlorosilane (SiH3Cl, abbreviated as MCS) gas, dichlorosilane (SiH2Cl2, abbreviated as DCS) gas, trichlorosilane (SiHCl3, abbreviated as TCS) gas, tetrachlorosilane (SiCl4, abbreviated as STC) gas, hexachlorodisilane (Si2Cl6, abbreviated as HCDS) gas and octachlorotrisilane (Si3Cl8, abbreviated as OCTS) gas may be used as the silicon source gas. For example, in the embodiments described above, a fluorosilane-based gas such as tetrafluorosilane (SiF4) gas and difluorosilane (SiH2F2) gas, a bromosilane-based gas such as tetrabromosilane (SiBr4) gas and dibromosilane (SiH2Br2) gas, or an iodine silane-based gas such as tetraiodide silane (SiI4) gas and diiodosilane (SiH2I2) gas may be used as the source gas. For example, an aminosilane-based gas such as tetrakis (dimethylamino) silane (Si[N(CH3)2]4, abbreviated as 4DMAS) gas, tris (dimethylamino) silane (Si[N(CH3)2]3H, abbreviated as 3DMAS) gas, bis (diethylamino) silane (Si[N(C2H5)2]2H2, abbreviated as BDEAS) gas and bis (tertiarybutylamino) silane (SiH2[NH(C4H9)]2, abbreviated as BTBAS) gas may be used as the source gas. For example, an organic silane source gas such as tetraethoxysilane (Si(OC2H5)4, abbreviated as TEOS) gas may be used as the source gas. One or more of the gases described above may be used as the source gas. Further, for example, in the embodiments described above, a gas such as oxygen (O2) gas, nitrous oxide (N2O) gas, nitrogen monoxide (NO) gas, nitrogen dioxide (NO2) gas, ozone (O3) gas, water vapor (H2O), carbon monoxide (CO) gas and carbon dioxide (CO2) gas may be used as the oxygen-containing gas. One or more of the gases described above may be used as the oxygen-containing gas.

For example, in the embodiments described above, the N2 (nitrogen) gas is used as the carrier gas. However, in the embodiments described above, instead of the N2 gas or in addition to the N2 gas, a gas such as helium (He) gas, neon (Ne) gas and argon (Ar) gas may be used as the carrier gas. Among rare gases, the helium (He) gas tends to generate the negative ion.

For example, the embodiments described above are described by way of an example in which the boat support base 218 includes the insulating structure 221 and the metal structure 222. However, an entirety of the boat support base 218 may be made of a metal. In such a case, the DC bias also applied to the boat support base 218 may act as a cathodic protection to block a stray current flowing between the boat support base 218 and an atmosphere adjacent thereto. For example, when cleaning the process chamber 201 with a halogen-based gas, it is possible to suppress the corrosion of the boat support base 218 (more specifically, the metal structure 222) and the rotating shaft 264 by a relatively small negative bias voltage. Further, when cleaning the process chamber 201, it is preferable to remove the boat 217 made of silicon carbide, which is easily etched by the halogen-based gas. In other words, a conductive boat is not essential for the purpose of the cathodic protection of the metal structure.

According to some embodiments of the present disclosure, it is possible to prevent (or suppress) the uniformity of the film formed on the surface of the substrate from deteriorating.

What is claimed is:

1. A substrate processing apparatus comprising:
   a process chamber;
   a process gas supplier through which a process gas is supplied into the process chamber;
   an exhauster through which an inner atmosphere of the process chamber is exhausted;
   a remote plasma generating structure configured to supply a plasma into the process chamber;
   a boat configured to accommodate a plurality of substrates in the process chamber;
   a rotary shaft configured to rotatably support the boat;
   an internal conductor provided inside the rotary shaft;
   a DC power supply configured to supply a DC bias to the internal conductor; and
   a boat support base configured to support the boat and to electrically connect the boat and the internal conductor, the boat comprising:
   an insulating structure provided at an upper end of the rotary shaft and configured to support the boat on an upper surface thereof; and
   a metal structure embedded in the insulating structure in a manner that an entire side peripheral surface of the metal structure is in contact with an covered by the insulating structure,
   wherein the boat as a whole is made of a non-metallic material, at least a part of a surface of the boat is conductive, and the boat is configured to electrically connect the internal conductor and the plurality of substrates.

2. The substrate processing apparatus of claim 1, further comprising:
   a slip ring provided outside the process chamber and configured to electrically connect the internal conductor and the DC power supply.

3. The substrate processing apparatus of claim 2, wherein the boat is made of a conductive silicon carbide.

4. The substrate processing apparatus of claim 1, wherein the metal structure is provided with a contact surface exposed from the upper surface of the insulating structure and in contact with the boat, and is configured to electrically connect the boat and the internal conductor.

5. The substrate processing apparatus of claim 4, wherein the contact surface is covered with a bottom plate of the boat.

6. The substrate processing apparatus of claim 4, wherein an upper end of the internal conductor protrudes further than an upper surface of the rotary shaft, and is in contact with the metal structure.

7. The substrate processing apparatus of claim 1, wherein the rotary shaft is of a cylindrical shape, and an insulator tube is provided between the rotary shaft and the internal conductor.

8. The substrate processing apparatus of claim 1, wherein the boat is made of a conductive silicon carbide.

9. The substrate processing apparatus of claim 1, wherein the boat is provided with a plurality of electrode plates horizontally oriented,
   wherein each of the plurality of electrode plates is of a ring shape, and wherein the number of the plurality of electrode plates is the same as that of the plurality of substrates supported by the plurality of electrode plates.

10. The substrate processing apparatus of claim 9, wherein the boat is configured such that the plurality of substrates are placed on upper surfaces of the plurality of electrode plates, respectively.

11. The substrate processing apparatus of claim 1, wherein the remote plasma generating structure comprises a plurality of electrodes extending in a vertical direction, connected to a high frequency power supply or an electrical ground, and configured to generate the plasma in a region extending from a lower portion to an upper portion of the process chamber.

12. The substrate processing apparatus of claim 11, further comprising
a buffer chamber constituting a gas dispersion space and provided with an opposing wall facing the plurality of substrates, and
wherein three electrodes are provided as the plurality of electrodes in the buffer chamber.

13. The substrate processing apparatus of claim 12, wherein the opposing wall is provided with a plurality of gas supply holes facing a plurality of process spaces formed between vertically adjacent substrates among the plurality of substrates, respectively.

14. The substrate processing apparatus of claim 1, wherein a voltage of the DC bias or an AC bias within a range from −10 kV to 10 kV is supplied to the internal conductor.

15. The substrate processing apparatus of claim 1, wherein the remote plasma generating structure is configured to supply the plasma intermittently excited by a high frequency power, and
wherein a positive DC bias against an electrically grounded housing is applied to the plurality of substrates through the boat.

16. A substrate processing method comprising:
(a) accommodating a plurality of substrates in a process chamber by a boat, wherein the boat as a whole is made of a non-metallic material and at least a part of a surface of the boat is conductive, wherein a rotary shaft arranged inside and outside the process chamber rotatably supports the boat, an internal conductor being provided inside the rotary shaft, the boat comprising:
an insulating structure provided at an upper end of the rotary shaft to support the boat on an upper surface thereof; and a metal structure embedded in the insulating structure in a manner that an entire side peripheral surface of the metal structure is in contact with and covered by the insulating structure;
(b) supplying a DC bias to the internal conductor via a DC power supply;
(c) supporting the boat with a boat support base, the boat support base electrically connecting the boat and the internal conductor;
(d) processing the plurality of substrates by supplying a process gas into the process chamber through a process gas supplier and supplying a plasma into the process chamber through a remote plasma generating structure; and
(e) exhausting an inner atmosphere of the process chamber through an exhauster,
wherein the boat is configured to electrically connect the internal conductor and the plurality of substrates.

17. A method of manufacturing a semiconductor device comprising the substrate processing method of claim 16.

18. A non-transitory computer-readable recording medium storing a program that causes, by a computer, a substrate processing apparatus to perform a process comprising the substrate processing method of claim 16.

19. The substrate processing apparatus of claim 1, wherein the boat is provided with a plurality of electrode plates horizontally oriented and corresponding to the plurality of substrates, and
wherein each of the plurality of electrode plates is of a disk shape whose diameter is smaller than that of corresponding one of the plurality of substrates and facing only a vicinity of a center of the corresponding one of the substrates.

* * * * *